(12) United States Patent
Takeshita et al.

(10) Patent No.: US 7,939,243 B2
(45) Date of Patent: May 10, 2011

(54) RESIN, RESIST COMPOSITION AND METHOD OF FORMING RESIST PATTERN

(75) Inventors: Masaru Takeshita, Kawasaki (JP); Jun Iwashita, Kawasaki (JP); Takeshi Iwai, Kawasaki (JP); Yuji Ohgomori, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 312 days.

(21) Appl. No.: 12/160,742

(22) PCT Filed: Dec. 26, 2006

(86) PCT No.: PCT/JP2006/325897
§ 371 (c)(1),
(2), (4) Date: Jul. 11, 2008

(87) PCT Pub. No.: WO2007/080782
PCT Pub. Date: Jul. 19, 2007

(65) Prior Publication Data
US 2010/0159389 A1     Jun. 24, 2010

(30) Foreign Application Priority Data
Jan. 13, 2006 (JP) ................................ 2006-005778
Sep. 28, 2006 (JP) ................................ 2006-265515

(51) Int. Cl.
*G03F 7/039* (2006.01)
*G03F 7/038* (2006.01)
*G03F 7/20* (2006.01)
*G03F 7/30* (2006.01)
*C08F 24/00* (2006.01)

(52) U.S. Cl. .................... 430/270.1; 430/325; 430/326; 430/910; 526/266; 526/270

(58) Field of Classification Search ........................ None
See application file for complete search history.

(56) References Cited

U.S. PATENT DOCUMENTS

| | | | |
|---|---|---|---|
| 5,945,517 A | 8/1999 | Nitta et al. | |
| 6,103,445 A * | 8/2000 | Willson et al. | 430/270.1 |
| 6,180,313 B1 | 1/2001 | Yukawa et al. | |
| 7,074,543 B2 | 7/2006 | Iwai et al. | |
| 2002/0151666 A1 | 10/2002 | Jung et al. | 526/264 |
| 2002/0187420 A1 * | 12/2002 | Barclay et al. | 430/270.1 |
| 2004/0175644 A1 * | 9/2004 | Abdourazak et al. | 430/270.1 |
| 2005/0282082 A1 * | 12/2005 | Tachibana et al. | 430/270.1 |
| 2009/0076201 A1 * | 3/2009 | Kusaka et al. | 524/113 |

FOREIGN PATENT DOCUMENTS

| | | |
|---|---|---|
| JP | H09-208554 | 8/1997 |
| JP | H11-35551 | 2/1999 |
| JP | H11-35552 | 2/1999 |
| JP | H11-35573 | 2/1999 |
| JP | H11-322707 | 11/1999 |
| JP | 2002-193884 | 7/2002 |
| JP | 2003-241385 | 8/2003 |
| JP | 2006-308647 | 11/2006 |
| JP | 2006-321767 | 11/2006 |
| WO | WO 2004/074242 | 9/2004 |

OTHER PUBLICATIONS

Andre et al., "Syntheses of L-threose and D-erythrose analogues modified at position 2", Tetrahedron Asymmetry, vol. 9, pp. 1359-1367 (1998).
Moret et al., "A Diastereoselective Synthesis of both *Quercus* Lactone Isomers Employing Allyl-Type Organometallics as Key Intermediates", Tetrahedron Letters, vol. 25, pp. 4491-4494 (1984).
Hadwiger at al., "NI (II)-Catalysed Reactions of Free D-Fructose Derivatives Modified at Positions C-5 and/or C-6", Journal of Carbohydrate Chemistry, vol. 17, pp. 1259-1267 (1998).
Lysenkova et al., "Study of the transformations of 2-C-(indol-3-yl) methyl-α-L-xylo-hex-3-ulofuranosonic acid (the open form of ascorbigen) in an acidic medium", Russian Chemical Bulletin, vol. 50, pp. 1309-1313, (2001).
International Search Report in connection with corresponding PCT Application No. PCT/JP2006/325897, dated Jan. 30, 2007.

* cited by examiner

*Primary Examiner* — Sin J. Lee
(74) *Attorney, Agent, or Firm* — Knobbe, Martens, Olson & Bear, LLP

(57) ABSTRACT

A resist composition including a base resin component (A) and an acid-generator component (B) which generates acid upon exposure, the component (A) including a resin (A1) which has a structural unit (a0) represented by general formula (a-0) shown below:

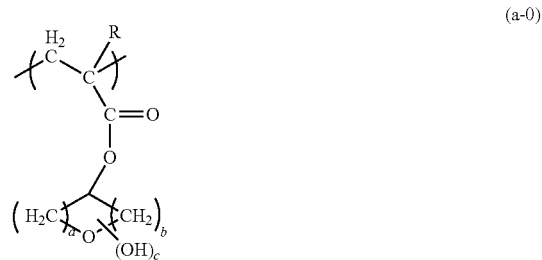

wherein R represents a hydrogen atom, a halogen atom, a lower alkyl group or a halogenated lower alkyl group; a represents an integer of 0 to 2; b represents an integer of 1 to 3; c represents an integer of 1 to 2; and a+b is an integer of 2 or more.

13 Claims, No Drawings

RESIN, RESIST COMPOSITION AND METHOD OF FORMING RESIST PATTERN

RELATED APPLICATIONS

This application is the U.S. National Phase filing under 35 U.S.C. §371 of PCT/JP2006/325897, filed Dec. 26, 2006, which designated the United States and was published in a language other than English, which claims priority under 35 U.S.C. §119(a)-(d) to Japanese Patent Application No. 2006-005778, filed Jan. 13, 2006, and Japanese Patent Application No. 2006-265515, filed Sep. 28, 2006. The contents of these applications are incorporated herein by reference in their entireties.

TECHNICAL FIELD

The present invention relates to a novel resin, a resist composition and a method of forming a resist pattern.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production.

Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist is used, which includes a base resin that exhibits a changed alkali solubility under action of acid and an acid generator that generates acid upon exposure.

For example, a chemically amplified positive resist contains, as a base resin, a resin which has acid dissociable dissolution inhibiting groups and exhibits increased alkali solubility under action of acid, and an acid generator. In the formation of a resist pattern, when acid is generated from the acid generator upon exposure, the exposed portions become alkali soluble.

On the other hand, a chemically amplified negative resist contains, for example, a resin component having a carboxy group, a cross-linking agent having an alcoholic hydroxyl group, and an acid generator. In the formation of a resist pattern, when acid is generated from the acid generator, the carboxy group of the resin component reacts with the alcoholic hydroxyl group of the cross-linking agent, and the resin component changes from alkali soluble to alkali insoluble.

Currently, resins that contain structural units derived from (meth)acrylate esters within the main chain (acrylic resins) are widely used as base resins for resists that use ArF excimer laser lithography, as they exhibit excellent transparency in the vicinity of 193 nm (see, for example, Patent Document 1).

[Patent Document 1] Japanese Unexamined Patent Application, First Publication No. 2003-241385

DISCLOSURE OF INVENTION

Problems to be Solved by the Invention

In future, in view of further requirements for various lithography properties such as high resolution, it is demanded to provide a novel resist material.

The present invention takes the above circumstances into consideration, with an object of providing a novel resin, a resist composition using the resin, and a method of forming a resist pattern using the resist composition.

Means to Solve the Problems

For solving the above-mentioned problems, the present inventors propose the following aspects.

Specifically, a first aspect of the present invention is a resist composition including a base resin component (A) and an acid-generator component (B) which generates acid upon exposure, the component (A) including a resin (A1) which has a structural unit (a0) represented by general formula (a-0) shown below:

[Chemical Formula 1]

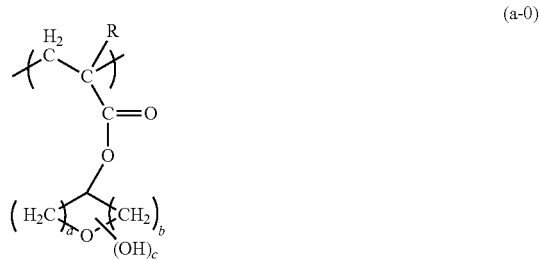

(a-0)

wherein R represents a hydrogen atom, a halogen atom, a lower alkyl group or a halogenated lower alkyl group; a represents an integer of 0 to 2; b represents an integer of 1 to 3; c represents an integer of 1 to 2; and a+b is an integer of 2 or more.

Further, a second aspect of the present invention is a method of forming a resist pattern, including: applying a resist composition of the above-mentioned first aspect of the present invention to a substrate to form a resist film on the substrate; conducting exposure of the resist film; and alkali-developing the resist film to form a resist pattern.

Furthermore, a third aspect of the present invention is a resin having a structural unit (a0) represented by general formula (a-0) above.

In the present description and claims, a "base resin component (A)" refers to a resin component which exhibits changed alkali solubility under action of acid, and includes a resin component (A') which exhibits increased alkali solubility under action of acid and an alkali-soluble resin component (A").

The term "exposure" is used as a general concept that includes irradiation with any form of radiation.

Effect of the Invention

According to the present invention, there are provided a novel resin, a resist composition using the resin, and a method of forming a resist pattern using the resist composition.

BEST MODE FOR CARRYING OUT THE INVENTION

<<Resist Composition>>

The resist composition of the present invention includes a base resin component (A) (hereafter referred to as "component (A)") and an acid-generator component (B) (hereafter, frequently referred to as "component (B)") which generates acid upon exposure.

Further, the component (A) contains a resin (A1) which has a structural unit (a0) represented by general formula (a-0) above.

In the resin (A1), the amount of the structural unit (a0) based on the combined total of all structural units constituting the resin (A1) is preferably 10 to 100 mol %, more preferably 15 to 100 mol %, and still more preferably 20 to 100 mol %. By making the amount of the structural unit (a0) 10 mol % or more, a pattern can be formed when the resin (A1) is used in a resist, and the effects of including the structural unit (a0) can be satisfactorily achieved.

Furthermore, the component (A) is preferably a resin component (A') (hereafter, referred to as "component (A')") which exhibits increased alkali solubility under action of acid. A resist composition containing the component (A') becomes a positive resist composition.

Alternatively, the resist composition of the present invention preferably contains an alkali-soluble resin component (A") (hereafter, referred to as "component (A")") as the component (A) and a cross-linker component (C) (hereafter, referred to as "component (C)"). Such a resist composition becomes a negative resist composition.

Hereinbelow, the positive resist composition and the negative resist composition will be described in detail.

(Positive Resist Composition)

The positive resist composition of the present invention includes the component (A') and the component (B).

In the positive resist composition, the component (A') is alkali insoluble prior to exposure. When acid is generated from the component (B) upon exposure, the acid dissociable, dissolution inhibiting groups are dissociated. As a result, the alkali solubility of the entire component (A') is increased, and hence, the component (A') changes from alkali insoluble to alkali soluble. Therefore, in the formation of a resist pattern, by conducting selective exposure of a resist film formed by using the positive resist composition, the exposed portions become alkali soluble, whereas the unexposed portions remain alkali insoluble, and hence, a resist pattern can be formed by alkali developing.

<Component (A')>

In the positive resist composition, the component (A') contains a resin (A1) having a structural unit (a0) represented by general formula (a-0) above.

It is preferable that the resin (A1) further has a structural unit (a1) derived from an acrylate ester having an acid dissociable, dissolution inhibiting group.

Further, it is preferable that the resin (A1) further has a structural unit (a3) derived from an acrylate ester having a polar group-containing aliphatic hydrocarbon group, excluding the structural unit (a0).

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom, or a group) bonded to the carbon atom on the α-position. As the substituent, a halogen atom, a lower alkyl group or a halogenated lower alkyl group can be mentioned. Examples of the halogen atom include a fluorine atom, a chlorine atom, a bromine atom and an iodine atom, and a fluorine atom is particularly desirable.

With respect to the "structural unit derived from an acrylate ester", the "α-position (the carbon atom on the α-position)" refers to the carbon atom having the carbonyl group bonded thereto, unless specified otherwise.

An "alkyl group" includes a linear, branched or cyclic, monovalent saturated hydrocarbon, unless otherwise specified.

A "lower alkyl group" is an alkyl group of 1 to 5 carbon atoms.

A "halogenated lower alkyl group" is a lower alkyl group in which a part or all of the hydrogen atoms have been substituted with halogen atoms. Examples of the halogen atom include a fluorine atom, a chlorine atom, a bromine atom and an iodine atom, and a fluorine atom is particularly desirable.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

In the present invention, it is preferable that a hydrogen atom, a halogen atom, a lower alkyl group or a halogenated lower alkyl group be bonded to the α-position of the acrylate ester, more preferably a hydrogen atom, a fluorine atom, a lower alkyl group or a fluorinated lower alkyl group. In terms of industrial availability, a hydrogen atom or a methyl group is particularly desirable.

In the present description, the term "(meth)acrylate" is a generic term that includes either or both of acrylate and methacrylate.

Structural Unit (a0)

The resin (A1) includes a structural unit (a0) represented by general formula (a-0) above. A positive resist composition using the resin (A1) is capable of forming a resist pattern. Further, by virtue of the resin (A1) including the structural unit (a0), the adhesiveness of the resist film to a substrate and hydrophilicity with a developing solution are improved, and hence, the same effects as the below-described structural unit (a2) can be obtained.

In general formula (a-0) above, R represents a hydrogen atom, a halogen atom, a lower alkyl group or a halogenated lower alkyl group. As the halogen atom, lower alkyl group and halogenated lower alkyl group for R, the same as the halogen atom, lower alkyl group and halogenated lower alkyl group which may be bonded to the α-position of the aforementioned acrylate ester can be exemplified. It is particularly desirable that R be a methyl group.

In general formula (a-0), a is an integer of 0 to 2, and is preferably 1.

b is an integer of 1 to 3, and is preferably 2.

c is an integer of 1 or 2, and is preferably 1.

a+b is an integer of 2 or more, preferably 2 to 4, and most preferably 3.

When c is 1, the substitution position of the hydroxyl group may be any position. It is particularly desirable that the hydroxyl group be bonded to the carbon atom adjacent to the carbon atom which is bonded to the terminal oxygen atom of —C(O)—O—. When c is 2, a desired combination of the substitution positions can be used.

Examples of structural units preferable as the structural unit (a0) are shown below.

[Chemical Formula 2]

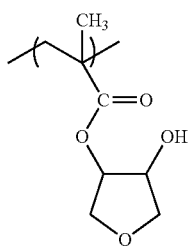
(a0-1)

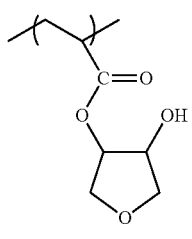
(a0-2)

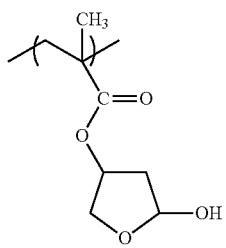
(a0-3)

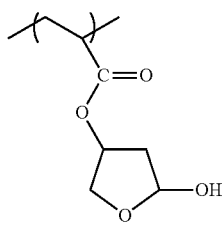
(a0-4)

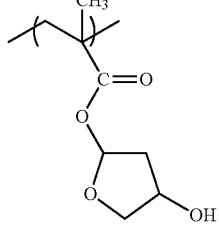
(a0-5)

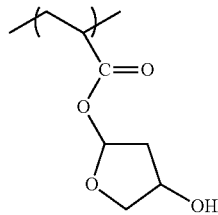
(a0-6)

Among the above examples, 3-methacryloyloxy-4-hydroxytetrahydrofuran represented by chemical formula (a0-1) and 3-acrylolyloxy-4-hydroxytetrahydrofuran represented by chemical formula (a0-2) are particularly desirable, and 3-methacryloyloxy-4-hydroxytetrahydrofuran represented by chemical formula (a0-1) is most preferable.

In the resin (A1) contained in the positive resist composition, as the structural unit (a0), one type of structural unit may be used, or two or more types may be used in combination.

In the resin (A1), the amount of the structural unit (a0) based on the combined total of all structural units constituting the resin (A1) is preferably 10 to 70 mol %, more preferably 10 to 60 mol %, and still more preferably 15 to 55 mol %. By making the amount of the structural unit (a0) 10 mol % or more, the effects of including the structural unit (a0) can be satisfactorily achieved. On the other hand, by making the amount of the structural unit (a0) no more than 70 mol %, a good balance can be achieved with the other structural units.

The monomers for deriving the structural unit (a0) can be produced as follows.

(1) Synthesis of Monomers Represented by Chemical Formulas (a0-1) and (a0-2)

The monomers corresponding to chemical formulas (a0-1) and (a0-2) can be produced by reacting cis-3,4-dihydroxytetrahydrofuran with one equivalent of methacryloyl chloride or acryloyl chloride in the presence of an organic base such as triethylamine or pyridine or an organic base such as sodium carbonate. The acid chloride can be replaced by the corresponding acid anhydride.

Alternatively, the objective monomer can be produced by reacting erythritan with methacrylic acid or acrylic acid in the presence of dicyclohexylcarbodiimide.

(2) Synthesis of Monomers Represented by Chemical Formulas (a0-3) and (a0-4)

As exemplified below, the objective compound can be produced by a conventional method. For example, as described in C. Andre, J. Bolte, C. Demuynck, Tetrahedron Asymmetry, vol. 9, p.1359 (1998), 2,2-dimethyl-1,3-dioxolane-4-ethyl acetate can be used as a raw material to obtain 3,4-dihydroxybutanal. Then, for example, tetrahydro-2,4-furandiol can be derived by the method described in E. Monet, M. Schlosser, Tetrahedron Letters, vol. 25, p.4491 (1984).

Subsequently, for example, tetrahydro-2,4-furan di(meth)acrylate can be obtained by the method described in P. Hadwiger, A. E. Stuetz, Journal of Carbohydrates Chemistry, vol. 17, p.1259 (1998). Finally, by treating tetrahydro-2,4-furan di(meth)acrylate with ammonia (see, for example, L. N. Lysenkova, M. I. Reznikova, A. M. Korolev, M. N. Preobrazhenskaya, Russian Chemical Bulletin, vol. 50, p.1309 (2001)), the objective monomer can be produced.

(3) Synthesis of Monomers Represented by Chemical Formulas (a0-5) and (a0-6)

The monomers represented by chemical formulas (a0-5) and (a0-6) can be derived from the above-described intermediate compound tetrahydro-2,4-furandiol as a raw material.

For example, the objective compound can be produced by reacting tetrahydro-2,4-furandiol with one equivalent of acryloyl chloride or methacryloyl chloride in the presence of an organic amine.

Structural Unit (a1)

In the present invention, it is preferable that the resin (A1) further have a structural unit (a1) derived from an acrylate ester having an acid dissociable, dissolution inhibiting group.

As the acid dissociable, dissolution inhibiting group within the structural unit (a1), any of the groups that have been proposed as acid dissociable, dissolution inhibiting groups for the base resins of chemically amplified resists can be used, provided the group has an alkali dissolution-inhibiting effect that renders the entire resin (A1) alkali-insoluble prior to exposure, and then following dissociation, causes the entire resin (A1) to change to an alkali-soluble state. Generally, groups that form either a cyclic or chain-like tertiary alkyl ester, or a cyclic or chain-like alkoxyalkyl ester with the carboxyl group of the (meth)acrylate ester are the most widely known. In the present description, the term "(meth) acrylic acid" is a generic term that includes either or both of acrylic acid and methacrylic acid. Further, the term "(meth) acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of the carboxyl group with a chain-like or cyclic tertiary alkyl group, and the tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with the carboxyl group are referred to as "tertiary alkyl ester-type acid dissociable, dissolution inhibiting groups".

Furthermore, a cyclic or chain-like alkoxyalkyl ester describes a structure in which an ester is formed by substituting the hydrogen atom of the carboxyl group with an alkoxyalkyl group, and the alkoxyalkyl group is bonded to the oxygen atom at the terminal of the carbonyloxy group (—C(O)—O—). In this alkoxyalkyl ester, the action of acid causes cleavage of the bond between the oxygen atom and the alkoxyalkyl group.

As the structural unit (a1), it is preferable to use at least one structural unit selected from the group consisting of structural units represented by a general formula (a1-0-1) shown below and structural units represented by a general formula (a1-0-2) shown below.

[Chemical Formula 3]

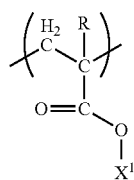

(a1-0-1)

wherein R represents a hydrogen atom, halogen atom, lower alkyl group, or halogenated lower alkyl group; and $X^1$ represents an acid dissociable, dissolution inhibiting group.

[Chemical Formula 4]

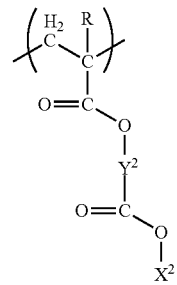

(a1-0-2)

wherein R represents a hydrogen atom, halogen atom, lower alkyl group, or halogenated lower alkyl group; $X^2$ represents an acid dissociable, dissolution inhibiting group; and $Y^2$ represents an alkylene group or an aliphatic cyclic group.

In general formula (a1-0-1) shown above, the halogen atom, lower alkyl group and halogenated lower alkyl group for R are the same as the halogen atom, lower alkyl group or halogenated lower alkyl group which can be bonded to the α-position of the aforementioned acrylate ester. It is particularly desirable that R be a methyl group.

There are no particular limitations on the group $X^1$, provided it functions as an acid dissociable, dissolution inhibiting group, and suitable examples include an alkoxyalkyl group or a tertiary alkyl ester-type acid-dissociable, dissolution-inhibiting group, although a tertiary alkyl ester-type acid dissociable, dissolution inhibiting group is preferable. Examples of suitable tertiary alkyl ester-type acid dissociable, dissolution inhibiting groups include aliphatic branched acid dissociable, dissolution inhibiting groups and acid dissociable, dissolution inhibiting groups that contain an aliphatic cyclic group.

In the present description and claims, the term "aliphatic" is a relative concept used in relation to the term "aromatic", and defines a group or compound that has no aromaticity. Further, the term "aliphatic cyclic group" refers to a polycyclic or monocyclic group that has no aromaticity.

The "aliphatic cyclic group" within the structural unit (a1) may or may not have a substituent. Examples of suitable substituent groups include lower alkyl groups of 1 to 5 carbon atoms, a fluorine atom, fluorinated lower alkyl groups of 1 to 5 carbon atoms, and an oxygen atom (═O).

The basic ring structure of the "aliphatic cyclic group" excluding substituent groups is not limited to groups consisting of carbon and hydrogen (hydrocarbon groups), although a hydrocarbon group is preferable. Furthermore, the "hydrocarbon group" may be either saturated or unsaturated, but is preferably saturated. The aliphatic cyclic group is preferably a polycyclic group.

Specific examples of this type of aliphatic cyclic group include groups in which one or more hydrogen atoms have been removed from a polycycloalkane such as a monocycloalkane, bicycloalkane, tricycloalkane or tetracycloalkane which may or may not be substituted with a lower alkyl group, a fluorine atom or a fluoroalkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Specific examples of suitable aliphatic branched acid dissociable, dissolution inhibiting groups include a tert-butyl group and a tert-amyl group.

Furthermore, examples of acid dissociable, dissolution inhibiting groups that contain an aliphatic cyclic group include groups that contain a tertiary carbon atom within the ring skeleton of a cycloalkyl group, and specific examples include a 2-methyl-2-adamantyl group or 2-ethyl-2-adamantyl group. Other possible groups include those that contain an aliphatic cyclic group such as an adamantyl group, and a branched alkylene group that contains a tertiary carbon atom and is bonded to the aliphatic cyclic group, such as the group shown within the structural unit represented by a general formula shown below.

[Chemical Formula 5]

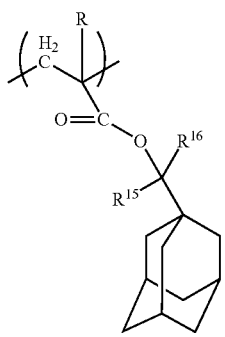

wherein R represents a hydrogen atom, halogen atom, lower alkyl group, or halogenated lower alkyl group; and $R^{15}$ and $R^{16}$ represent alkyl groups (which may be either linear or branched groups, and preferably have 1 to 5 carbon atoms).

In the above formula, the halogen atom, lower alkyl group and halogenated lower alkyl group for R are the same as the halogen atom, lower alkyl group or halogenated lower alkyl group which can be bonded to the α-position of the aforementioned acrylate ester.

Furthermore, the above alkoxyalkyl groups are preferably groups represented by general formula shown below.

[Chemical Formula 6]

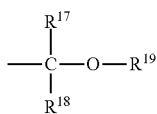

wherein $R^{17}$ and $R^{18}$ each independently represents a linear or branched alkyl group or a hydrogen atom, and $R^{19}$ represents a linear, branched or cyclic alkyl group. Furthermore, $R^{17}$ and $R^{19}$ may be bonded together at their respective terminals to form a ring The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic group which preferably has 1 to 15 carbon atoms, and may be any of linear, branched or cyclic.

When $R^{19}$ represents a linear or branched group, it preferably has 1 to 5 carbon atoms, and is preferably a methyl group or an ethyl group, and an ethyl group is most preferable.

When $R^{19}$ represents a cycloalkyl group, it preferably has 4 to 15 carbon atoms, more preferably 4 to 12 carbon atoms, and most preferably 5 to 10 carbon atoms. As examples of the cyclic group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from monocycloalkanes such as cyclopentane and cyclohexane, and groups in which one or more hydrogen atoms have been removed from polycycloalkanes such as adamantane, norbornane, isobornane, tricyclodecane and tetracyclododecane. Of these, a group in which one or more hydrogen atoms have been removed from adamantane is preferable.

Furthermore, in the above formula, $R^{17}$ and $R^{19}$ may each independently represent an alkylene group of 1 to 5 carbon atoms, wherein the terminal of $R^{19}$ and the terminal of $R^{17}$ are bonded together.

In such cases, a cyclic group is formed of the groups $R^{17}$ and $R^{19}$, the oxygen atom bonded to $R^{19}$, and the carbon atom that is bonded to this oxygen atom and the group $R^{17}$. This type of cyclic group is preferably a 4- to 7-membered ring, and more preferably 4- to 6-membered rings. Specific examples of these cyclic groups include a tetrahydropyranyl group and a tetrahydrofuranyl group.

In general formula (a1-0-2), the halogen atom, lower alkyl group and halogenated lower alkyl group for R are the same as the halogen atom, lower alkyl group or halogenated lower alkyl group which can be bonded to the α-position of the aforementioned acrylate ester.

The group $X^2$ is as described for $X^1$ in the formula (a1-0-1).

$Y^2$ is an alkylene group of 1 to 4 carbon atoms or a divalent aliphatic cyclic group.

As the divalent aliphatic cyclic group, the same as those exemplified above in connection with the explanation of "aliphatic cyclic group" in the structural unit (a1) can be used, except that two hydrogen atoms have been removed therefrom.

Specific examples of the structural unit (a1) include structural units represented by general formulas (a1-1) to (a1-4) shown below.

[Chemical Formula 7]

(a1-1)

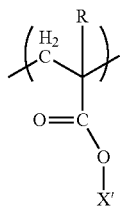

-continued

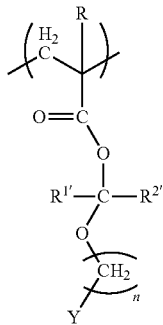
(a1-2)

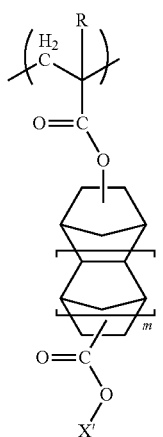
(a1-3)

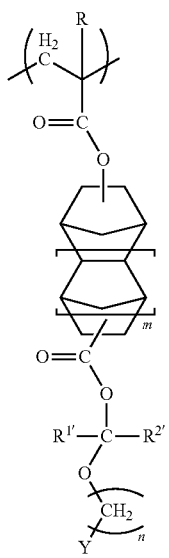
(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents 0 or 1; R represents a hydrogen atom, halogen atom, lower alkyl group, or halogenated lower alkyl group; and $R^{1'}$ and $R^{2'}$ each independently represents a hydrogen atom or a lower alkyl group of 1 to 5 carbon atoms.

In general formulas (a1-1) to (a1-4), the halogen atom, lower alkyl group and halogenated lower alkyl group for R are the same as the halogen atom, lower alkyl group or halogenated lower alkyl group which can be bonded to the α-position of the aforementioned acrylate ester.

It is preferable that at least one of $R^{1'}$ and $R^{2'}$ represent a hydrogen atom, and it is more preferable that both of $R^{1'}$ and $R^{2'}$ represent a hydrogen atom.

n is preferably 0 or 1.

Examples of the tertiary alkyl ester-type acid dissociable, dissolution inhibiting group for X' are the same as the tertiary alkyl ester-type acid dissociable, dissolution inhibiting groups exemplified above for $X^1$.

Examples of the aliphatic cyclic group for Y are the same as those exemplified above in connection with the explanation of "aliphatic cyclic group" in structural unit (a1).

Specific examples of structural units represented by general formula (a1-1) to (a1-4) are shown below.

[Chemical Formula 8]

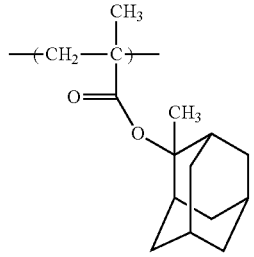
(a1-1-1)

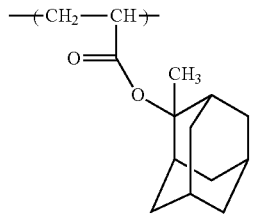
(a1-1-2)

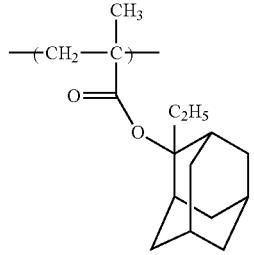
(a1-1-3)

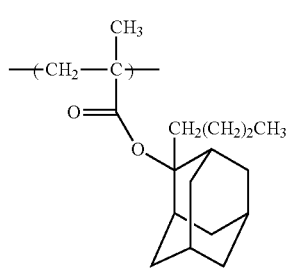
(a1-1-4)

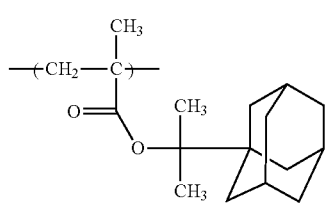
(a1-1-5)

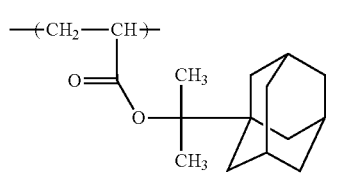
(a1-1-6)
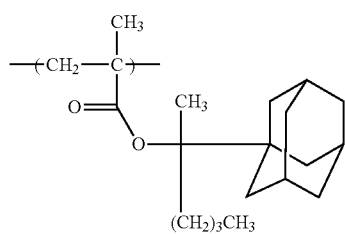
(a1-1-7)
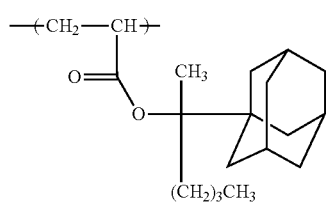
(a1-1-8)
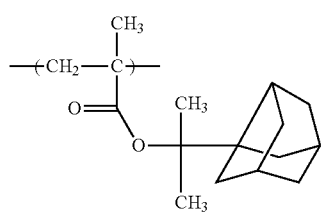
(a1-1-9)
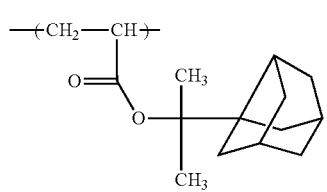
(a1-1-10)
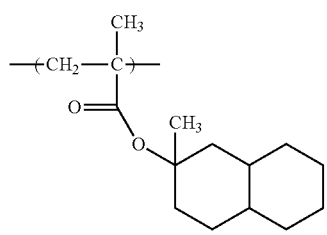
(a1-1-11)
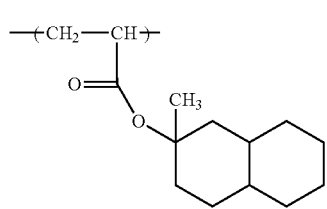
(a1-1-12)
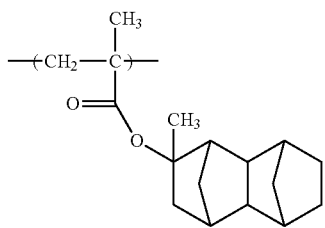
(a1-1-13)
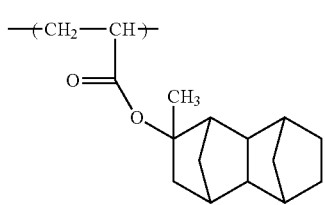
(a1-1-14)
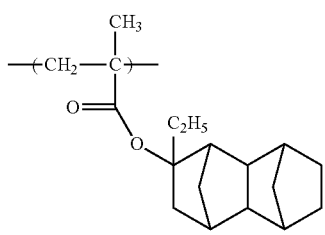
(a1-1-15)
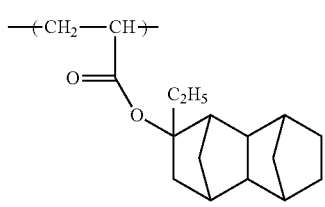
(a1-1-16)
[Chemical Formula 9]
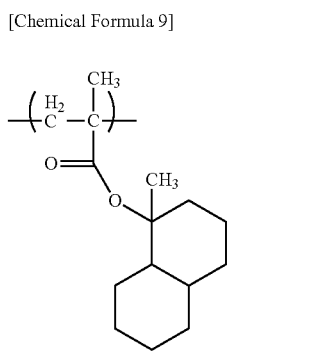
(a1-1-17)
(a1-1-18)

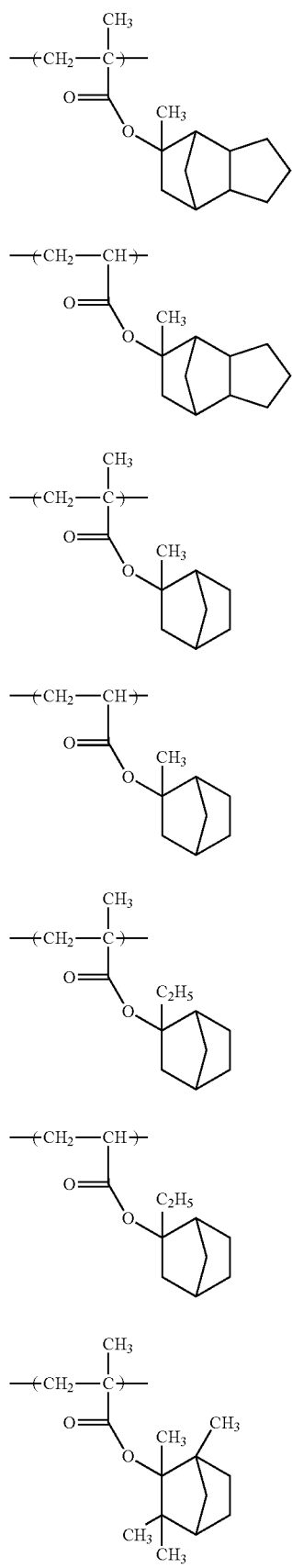
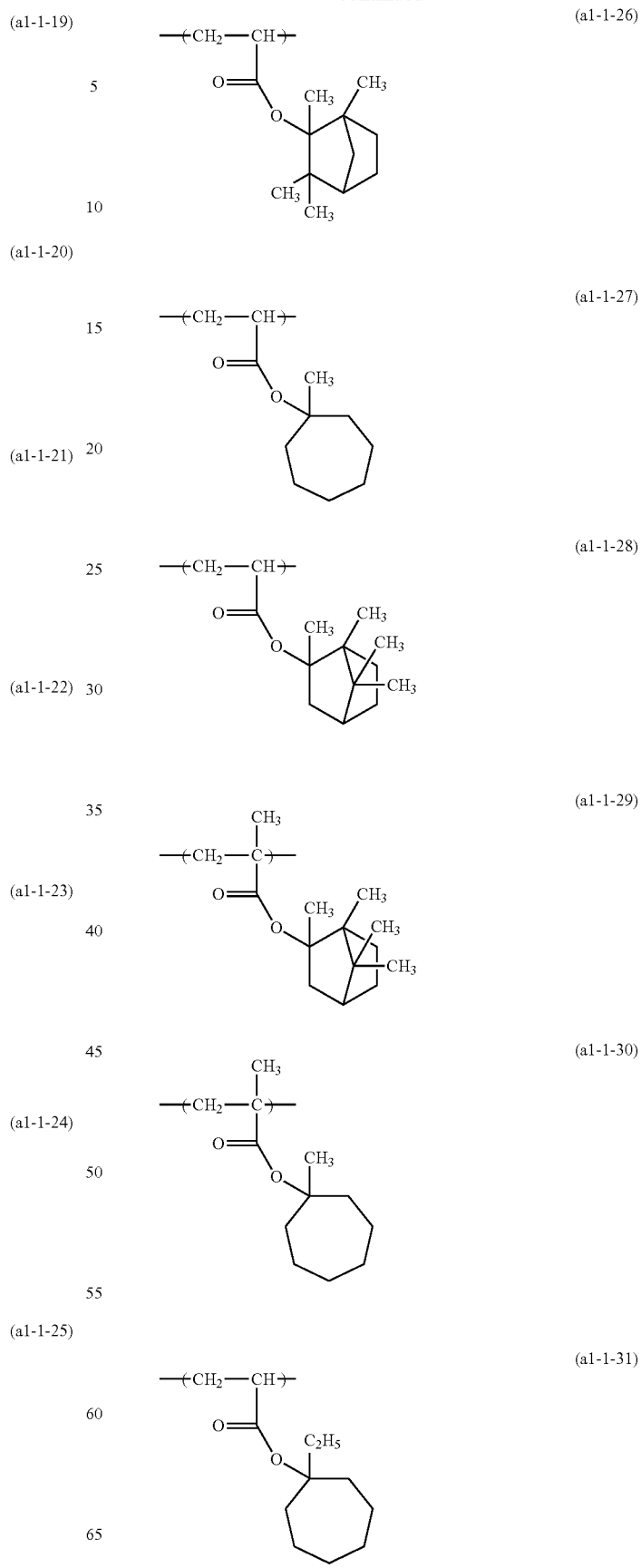

(a1-1-32) 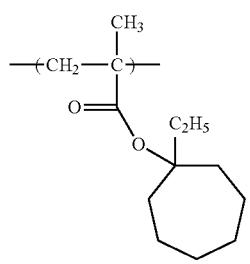
[Chemical Formula 10]
(a1-1-33) 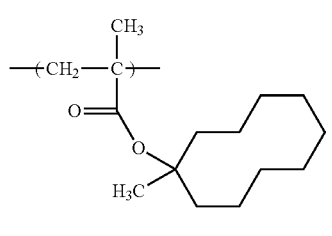
(a1-1-34) 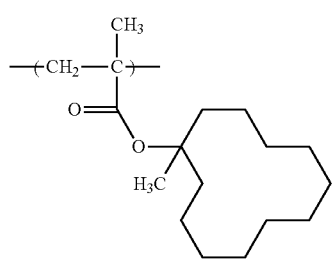
(a1-1-35) 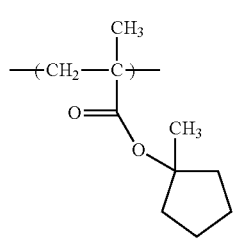
(a1-1-36) 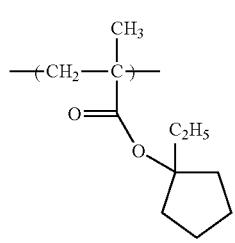
(a1-1-37) 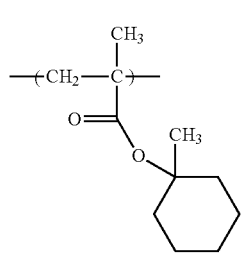
(a1-1-38) 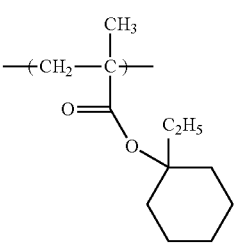
(a1-1-39) 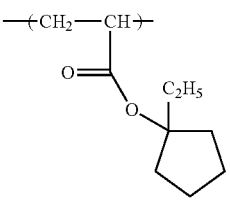
(a1-1-40) 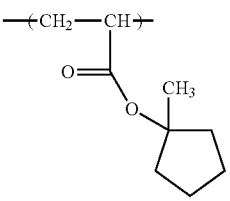
(a1-1-41) 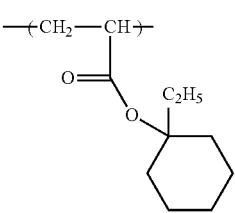
(a1-1-42) 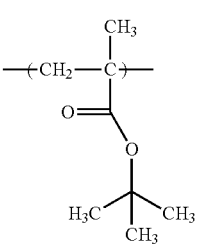
(a1-1-43) 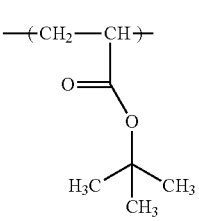
(a1-1-44) 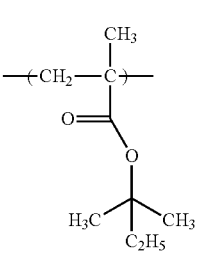

(a1-1-45)
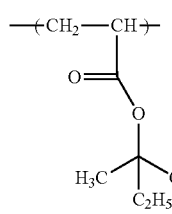
[Chemical Formula 11]
(a1-2-1)
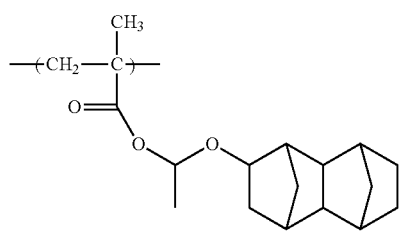
(a1-2-2)
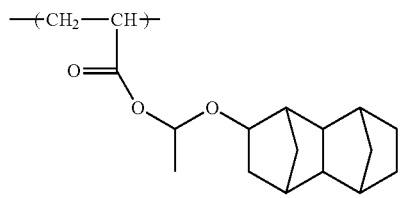
(a1-2-3)
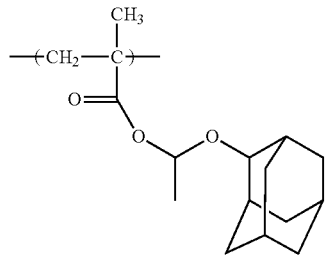
(a1-2-4)
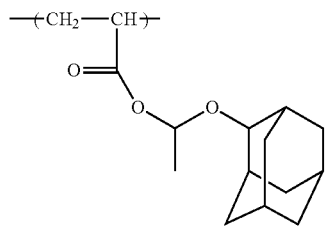
(a1-2-5)
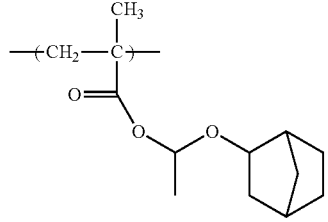
(a1-2-6)
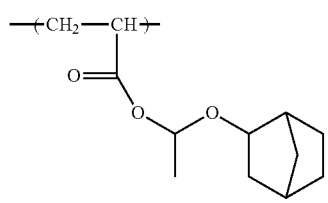
[Chemical Formula 12]
(a1-2-7)
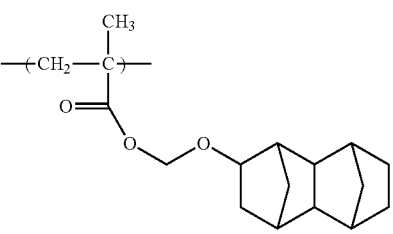
(a1-2-8)
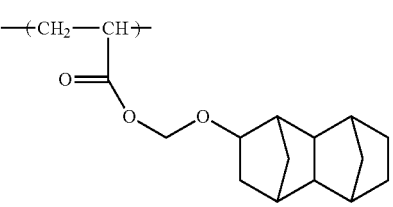
(a1-2-9)
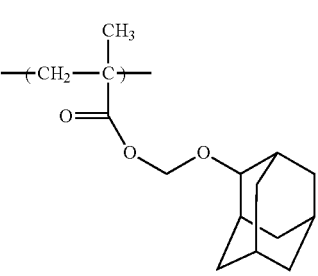
(a1-2-10)
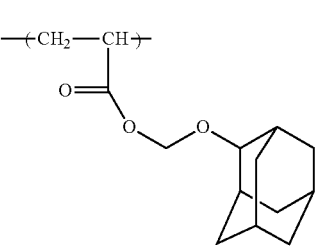
(a1-2-11)
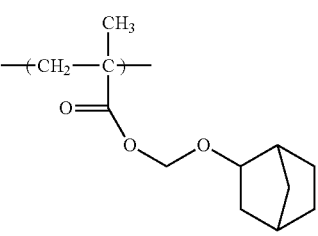
(a1-2-12)
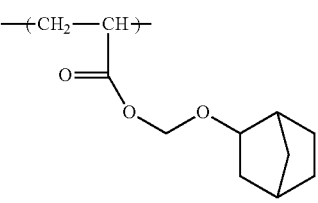

(a1-2-13)
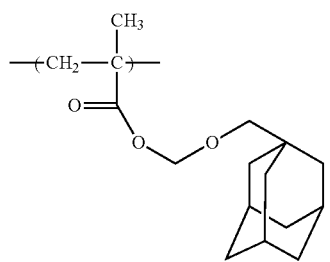
(a1-2-14)
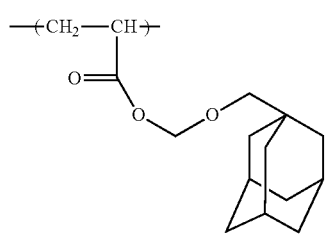
(a1-2-15)
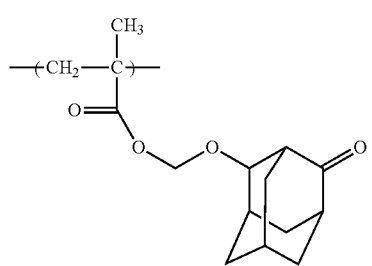
(a1-2-16)
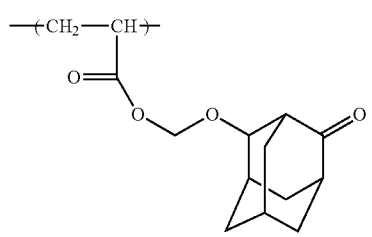
(a1-2-17)
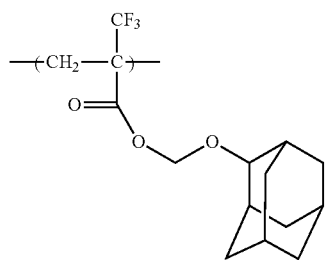
(a1-2-18)
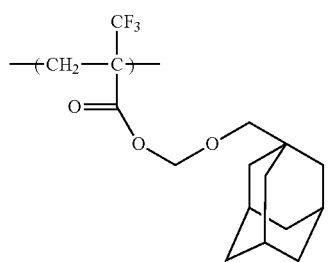
(a1-2-19)
(a1-2-20)
(a1-2-21)
[Chemical Formula 13]
(a1-2-22)
(a1-2-23)
(a1-2-24)

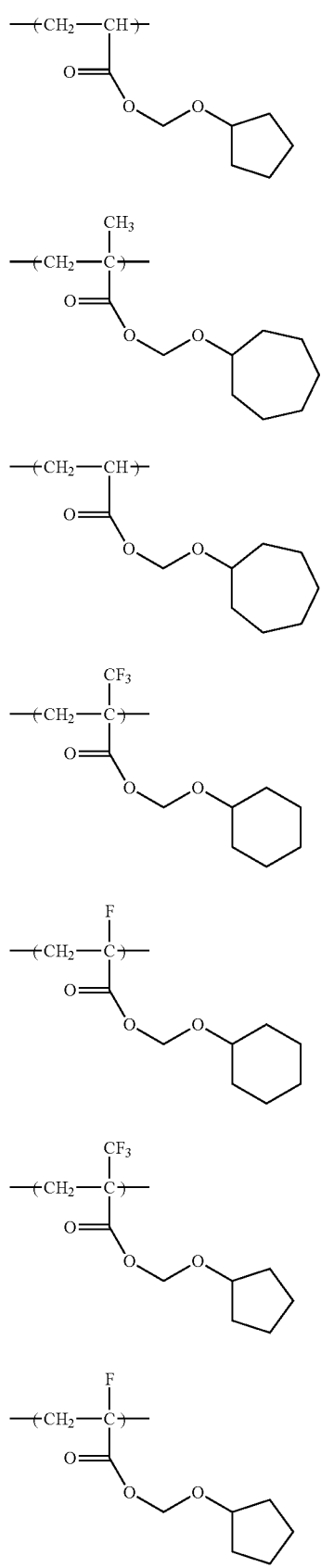
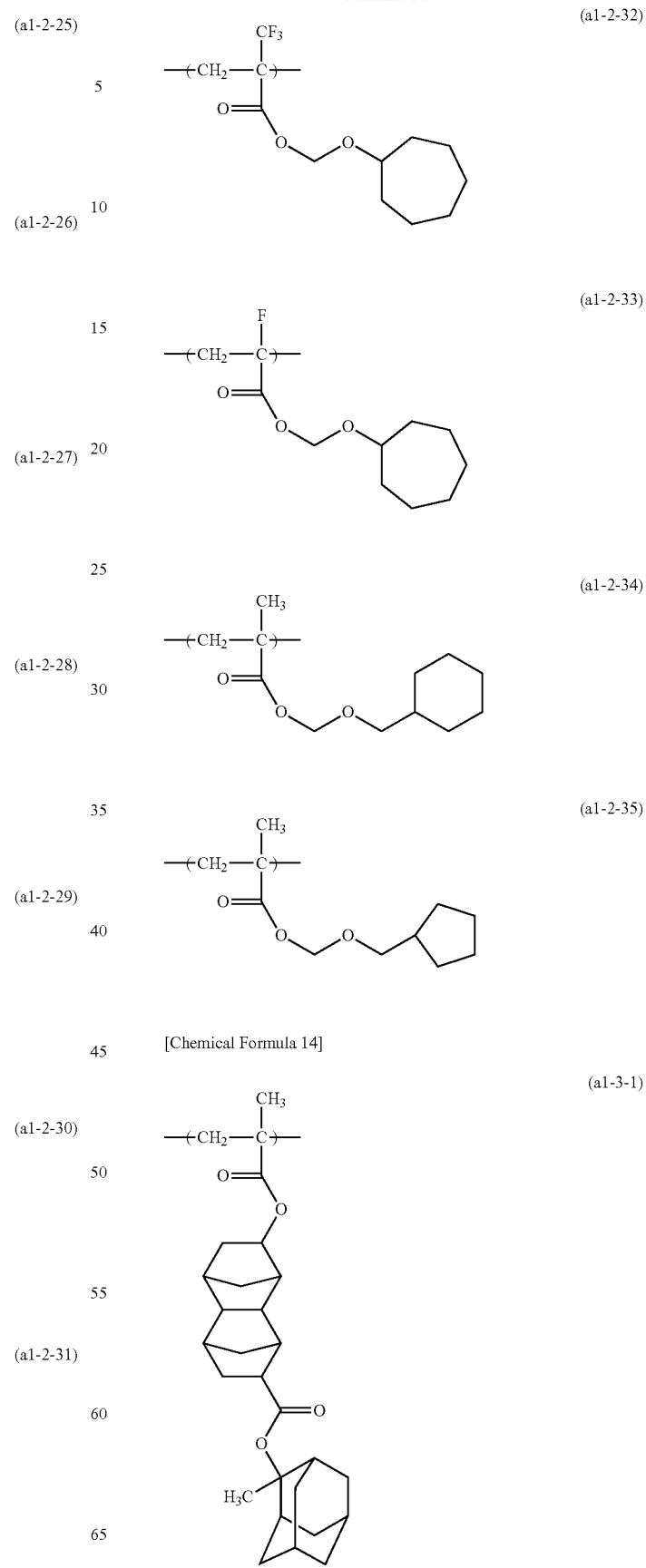
[Chemical Formula 14]

(a1-3-2) 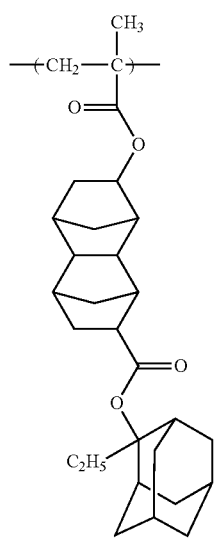
(a1-3-3) 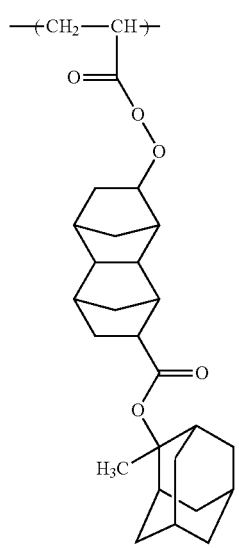
(a1-3-4) 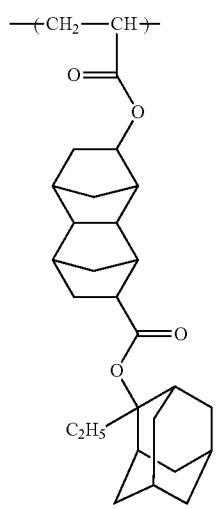
(a1-3-5) 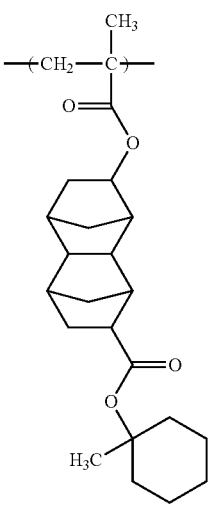
(a1-3-6) 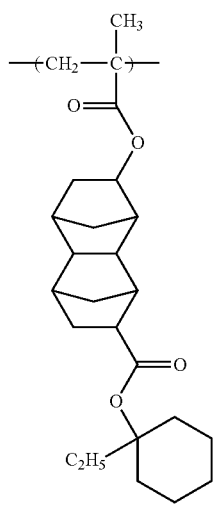
(a1-3-7) 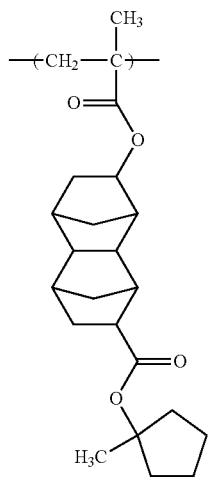

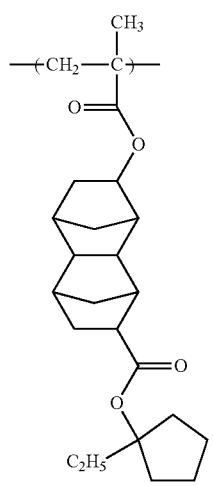 (a1-3-8)
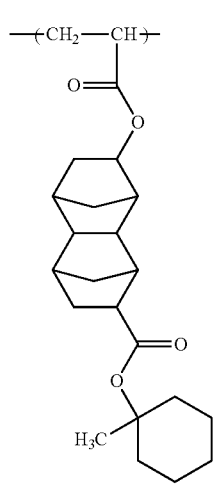 (a1-3-9)
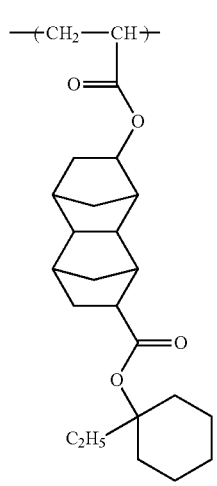 (a1-3-10)
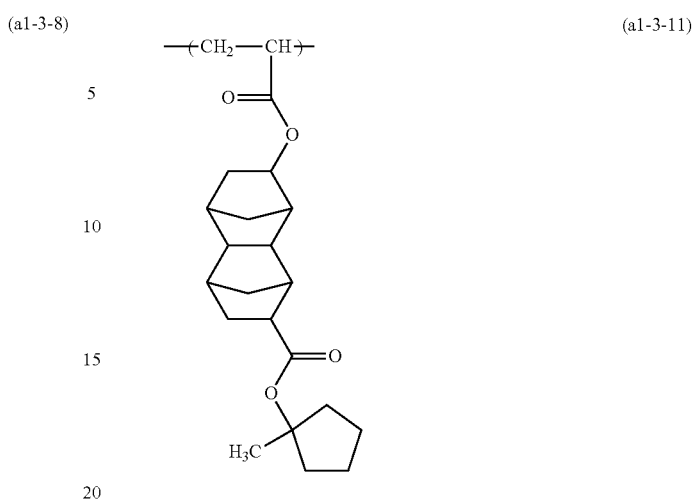 (a1-3-11) (a1-3-12)
[Chemical Formula 15]
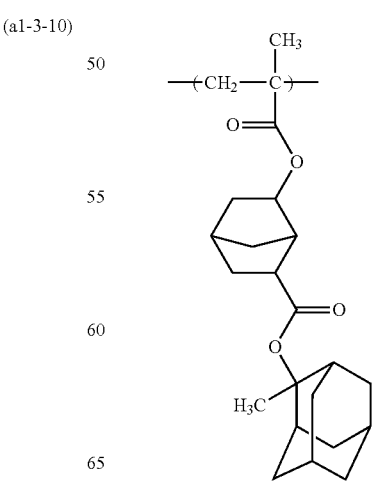 (a1-3-13)

(a1-3-14)
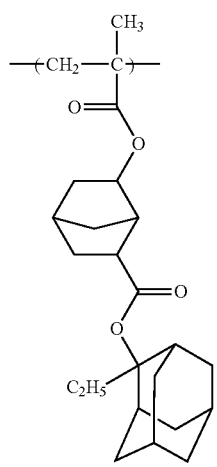
(a1-3-15)
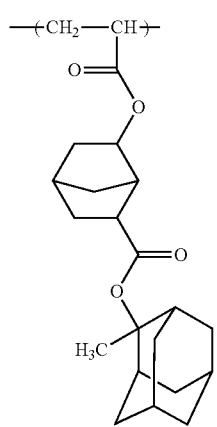
(a1-3-16)
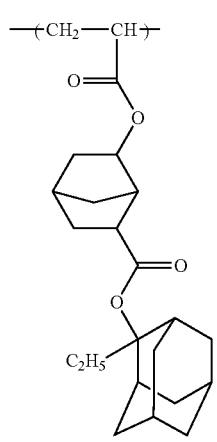
(a1-3-17)
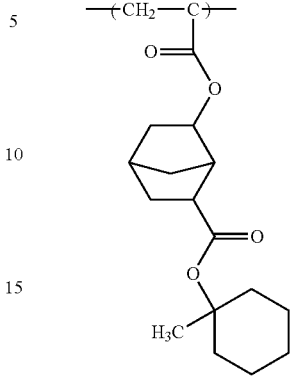
(a1-3-18)
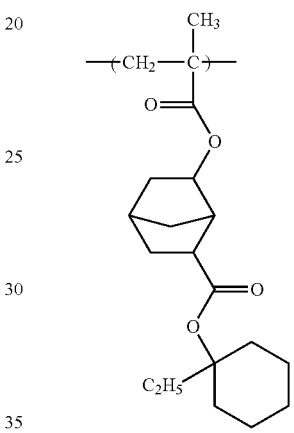
(a1-3-19)
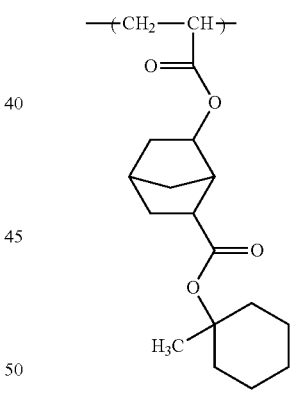
(a1-3-20)
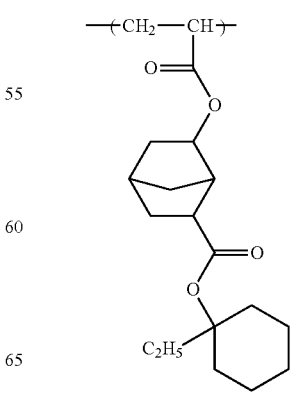

(a1-3-21)
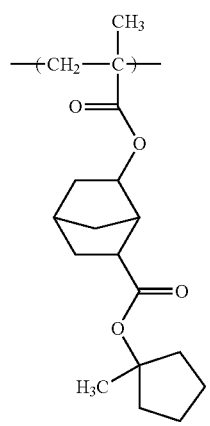
(a1-3-22)
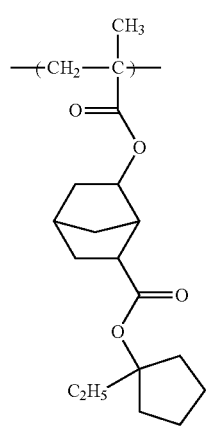
(a1-3-23)
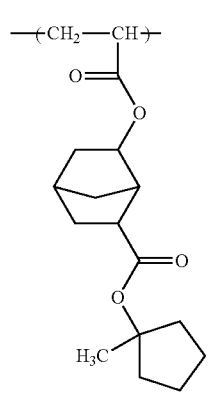
(a1-3-24)
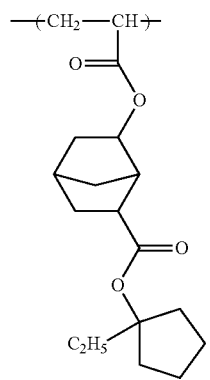
[Chemical Formula 16]
(a1-4-1)
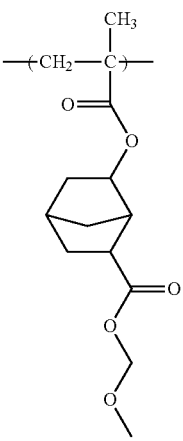
(a1-4-2)
(a1-4-3)
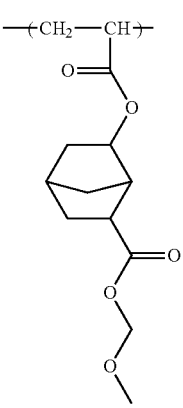

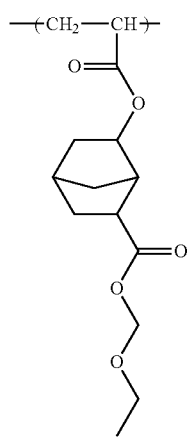
(a1-4-4)
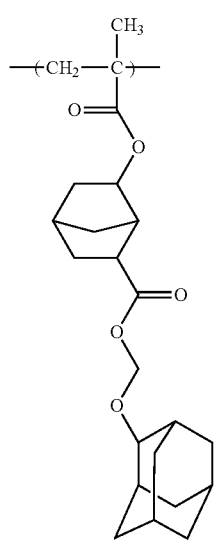
(a1-4-5)
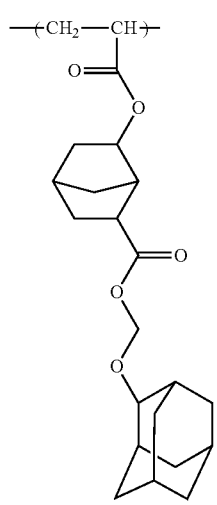
(a1-4-6)
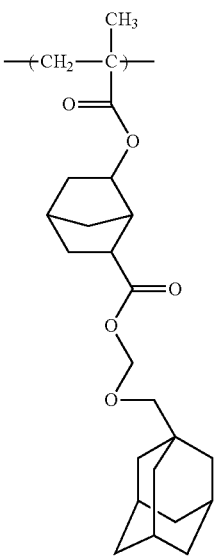
(a1-4-7)
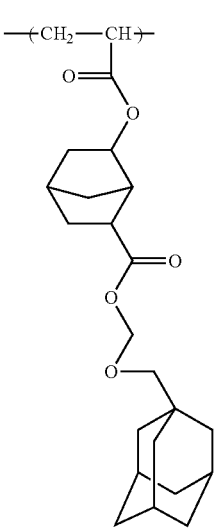
(a1-4-8)
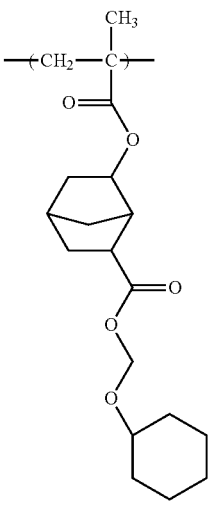
(a1-4-9)

(a1-4-10) 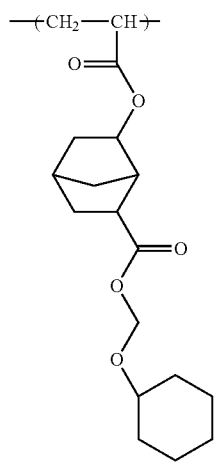
(a1-4-11) 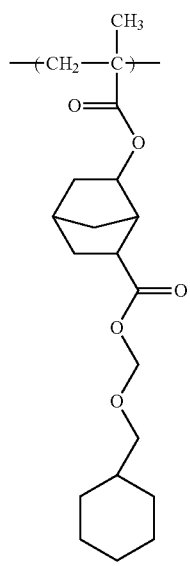
(a1-4-12) 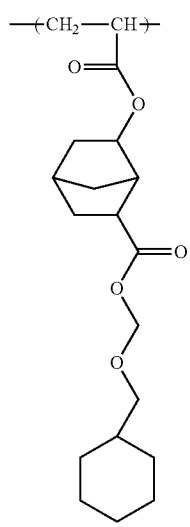
(a1-4-13) 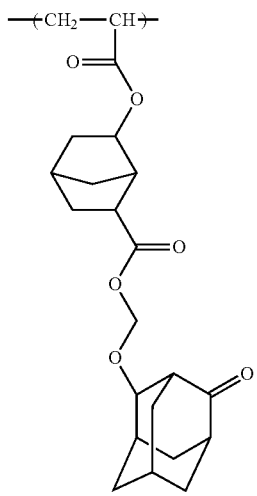
(a1-4-14) 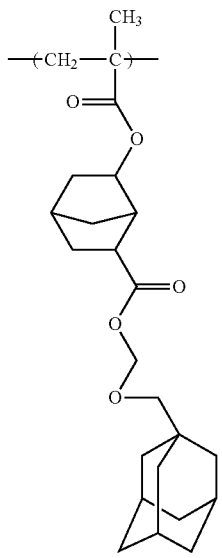
(a1-4-15) 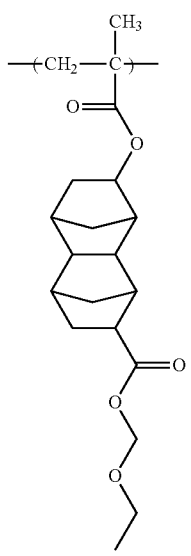

[Chemical Formula 17]
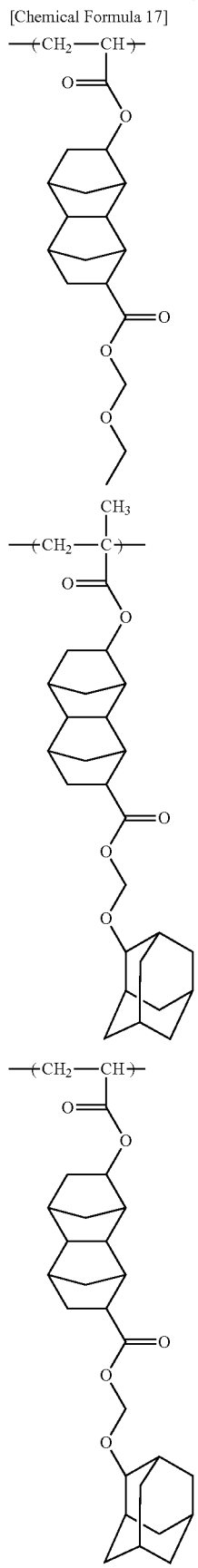
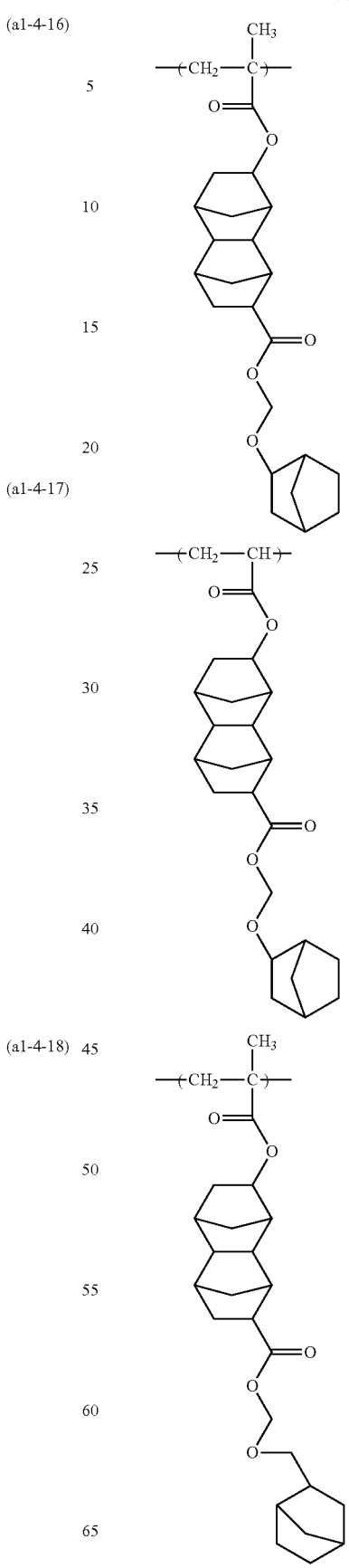

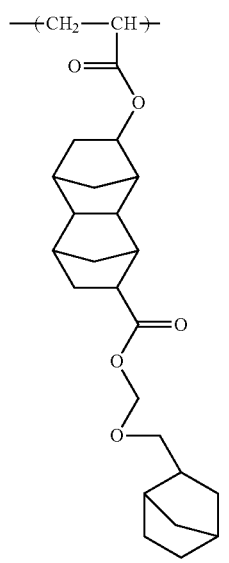
(a1-4-22)
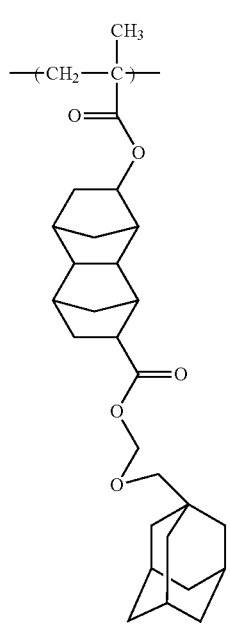
(a1-4-23)
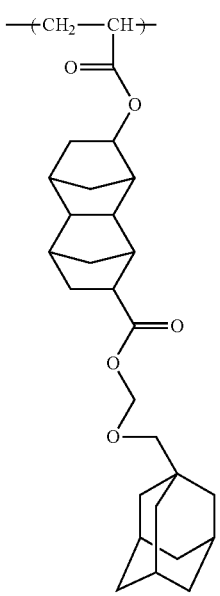
(a1-4-24)
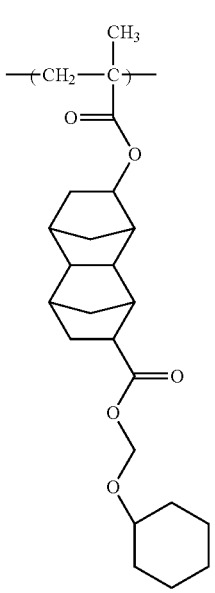
(a1-4-25)

(a1-4-26)
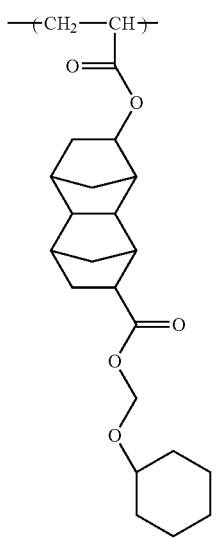
(a1-4-28)
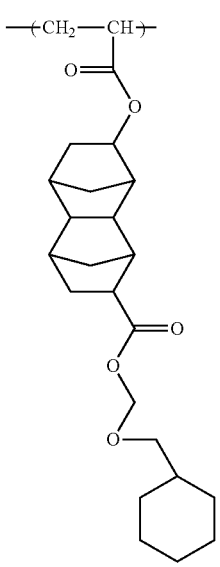
(a1-4-27)
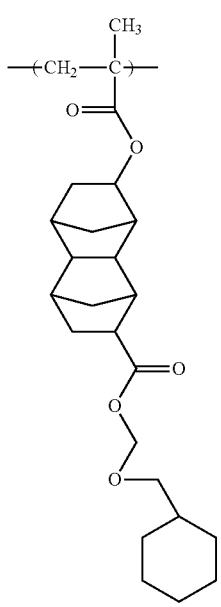
(a1-4-29)
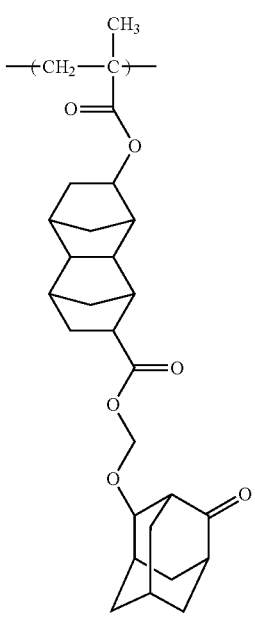

-continued

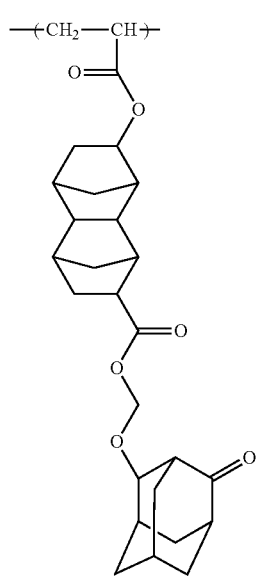
(a1-4-30)

In the resin (A1) contained in the positive resist composition, as the structural unit (a1), one type of structural unit may be used, or two or more types may be used in combination.

Among these, structural units represented by general formula (a1-1), structural units represented by general formula (a1-3) and structural units represented by general formula (a1-4) are preferable. More specifically, at least one structural unit selected from the group consisting of structural units represented by formulas (a1-1-1) to (a1-1-6), (a1-1-35) to (a1-1-43), (a1-3-17) to (a1-3-24) and (a1-4-9) to (a1-4-10) is more preferable.

Further, as the structural unit (a1), structural units represented by general formula (a1-1-01) shown below which includes the structural units represented by formulas (a1-1-1) to (a1-1-4) are preferable, as the shape of the resist pattern becomes excellent.

Furthermore, structural units represented by general formula (a1-1-02) shown below which includes the structural units represented by formulas (a1-1-35) to (a1-1-41) are preferable, as the mask error factor (MEF) becomes excellent.

The MEF is a parameter that indicates how faithfully mask patterns of differing dimensions can be reproduced by using the same exposure dose with fixed pitch and changing the mask size (the line width of a line and space pattern). The closer the MEF value is to 1, the better the mask reproducibility.

In addition, structural units represented by general formula (a1-1-03) shown below which includes the structural units represented by formulas (a1-1-42) to (a1-1-43), structural units represented by general formula (a1-1-04) shown below which includes the structural units represented by formulas (a1-3-17) to (a1-3-24) and structural units represented by general formula (a1-1-05) shown below which includes the structural units represented by formulas (a1-4-9) to (a1-4-10) are particularly desirable.

[Chemical Formula 18]

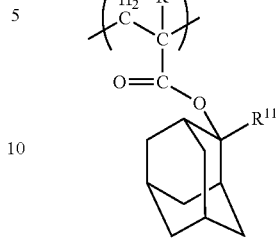
(a1-1-01)

wherein R represents a hydrogen atom, halogen atom, lower alkyl group, or halogenated lower alkyl group; and $R^{11}$ represents a lower alkyl group.

[Chemical Formula 19]

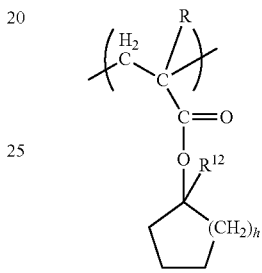
(a1-1-02)

wherein R represents a hydrogen atom, halogen atom, lower alkyl group, or halogenated lower alkyl group; $R^{12}$ represents a lower alkyl group; and h represents an integer of 1 to 3.

[Chemical Formula 20]

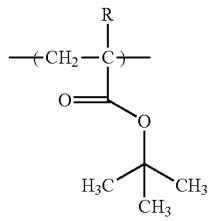
(a1-1-03)

wherein R represents a hydrogen atom, halogen atom, lower alkyl group, or halogenated lower alkyl group.

[Chemical Formula 21]

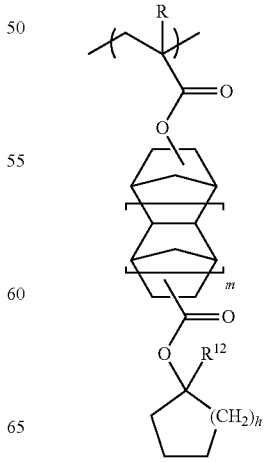
(a1-1-04)

wherein R represents a hydrogen atom, halogen atom, lower alkyl group, or halogenated lower alkyl group; $R^{12}$ represents a lower alkyl group; m represents 0 or 1; and h represents an integer of 1 to 3.

[Chemical Formula 22]

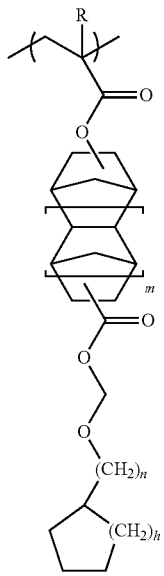

(a1-1-05)

wherein R represents a hydrogen atom, halogen atom, lower alkyl group, or halogenated lower alkyl group; m represents 0 or 1; n represents an integer of 0 to 3; and h represents an integer of 1 to 3.

In general formula (a1-1-01), R is the same as R defined in general formula (a1-1) above. The lower alkyl group for $R^{11}$ is the same as the lower alkyl group for R above, and is preferably a methyl group or an ethyl group.

In general formula (a1-1-02), R is the same as R defined in general formula (a1-1) above. The lower alkyl group for $R^{12}$ is the same as the lower alkyl group for R above, and is preferably a methyl group or an ethyl group, and most preferably an ethyl group. h is preferably 1 or 2, and most preferably 2.

In general formula (a1-1-03), R is the same as R defined in general formula (a1-1) above.

In general formula (a1-1-04), R is the same as R defined in general formula (a1-3) above. The lower alkyl group for $R^{12}$ is the same as the lower alkyl group for R above, and is most preferably a methyl group. h is preferably 1 or 2, and most preferably 2. m is preferably 0.

In general formula (a1-1-05), R is the same as R defined in general formula (a1-4) above. h is preferably 1 or 2, and most preferably 2. m is preferably 0. n is preferably 0 or 1, and more preferably 0.

In the resin (A1), the amount of the structural unit (a1) based on the combined total of all structural units constituting the resin (A1) is preferably 10 to 80 mol %, more preferably 15 to 70 mol %, and still more preferably 15 to 50 mol %. By making the amount of the structural unit (a1) 10 mol % or more, a pattern can be easily formed using a resist composition prepared from the resin (A1). On the other hand, by making the amount of the structural unit (a1) no more than 80 mol %, a good balance can be achieved with the other structural units.

Structural Unit (a3)

In the present invention, it is preferable that the component (A1) further have a structural unit (a3) derived from an acrylate ester having a polar group-containing aliphatic hydrocarbon group, excluding the structural unit (a0). By including the structural unit (a3), the hydrophilicity of the component (A) is improved, and hence, the affinity of the component (A) for the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which one or more hydrogen atoms have been removed from a bicycloalkane, tricycloalkane, tetracycloalkane or the like. Specific examples include groups in which one or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by general formulas (a3-1), (a3-2), and (a3-3) shown below are preferable.

[Chemical Formula 23]

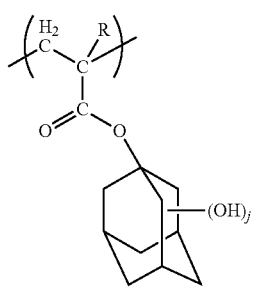

(a3-1)

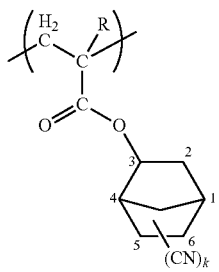

(a3-2)

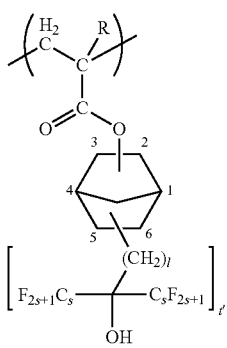

(a3-3)

wherein R represents a hydrogen atom, halogen atom, lower alkyl group, or halogenated lower alkyl group; j is an integer of 1 to 3; k is an integer of 1 to 3; t' is an integer of 1 to 3; l is an integer of 1 to 5; and s is an integer of 1 to 3.

In general formulas (a3-1) to (a3-3), the halogen atom, lower alkyl group and halogenated lower alkyl group for R are the same as the halogen atom, lower alkyl group or halogenated lower alkyl group which can be bonded to the α-position of the aforementioned acrylate ester.

In general formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In general formula (a3-2), k is preferably 1. The cyano group is preferably bonded to the 5th or 6th position of the norbonyl group.

In general formula (a3-3), t' is preferably 1, l is preferably 1 and s is preferably 1. Further, in formula (a3-3), it is preferable that a 2-norbonyl group or 3-norbonyl group be bonded to the terminal of the carboxy group of the acrylic acid. The fluorinated alkyl alcohol (hydroxyalkyl group in which a part of the hydrogen atoms within the alkyl group is substituted with fluorine atoms) is preferably bonded to the 5th or 6th position of the norbonyl group.

In the resin (A1) contained in the positive resist composition, as the structural unit (a3), one type of structural unit may be used, or two or more types may be used in combination.

In the resin (A1), the amount of structural unit (a3) based on the combined total of all structural units constituting the resin (A1) is preferably 5 to 50 mol %, more preferably 5 to 40 mol %, and still more preferably 5 to 25 mol %.

Structural Unit (a2)

In the present invention, the resin (A1) may further have a structural unit (a2) derived from an acrylate ester having a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the resin (A1) is used for forming a resist film, the lactone-containing cyclic group of the structural unit (a2) is effective in improving the adhesion between the resist film and the substrate, and increasing the hydrophilicity for the developing solution.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 24]

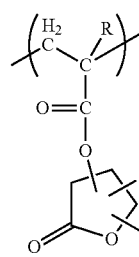

(a2-1)

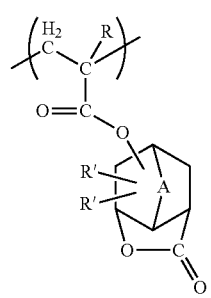

(a2-2)

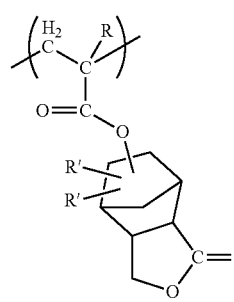

(a2-3)

(a2-4)
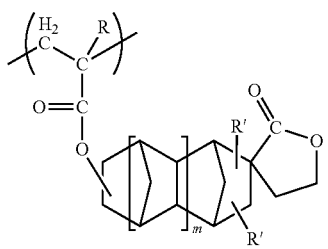

(a2-5)
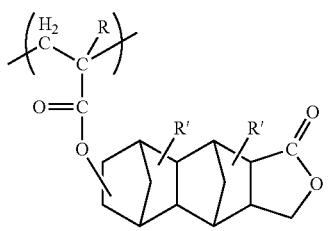

wherein R represents a hydrogen atom, a halogen atom, a lower alkyl group or a halogenated lower alkyl group; R' represents a hydrogen atom, a lower alkyl group or an alkoxy group of 1 to 5 carbon atoms; m represents 0 or 1; and A represents an alkylene group of 1 to 5 carbon atoms or an oxygen atom.

In general formulas (a2-1) to (a2-5), R is the same as R in the structural unit (a0).

The lower alkyl group for R' is the same as the lower alkyl group for R described above.

In the structural units represented by general formulas (a2-1) to (a2-5), in consideration of industrial availability, R' is preferably a hydrogen atom.

Specific examples of alkylene groups of 1 to 5 carbon atoms for A include a methylene group, ethylene group, n-propylene group and isopropylene group.

Specific examples of structural units represented by general formulas (a2-1) to (a2-5) above are shown below.

[Chemical Formula 25]

(a2-1-1)
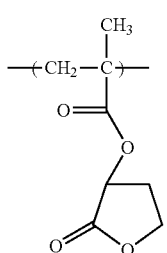

(a2-1-2)
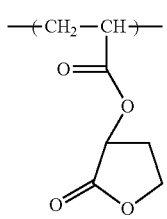

(a2-1-3)
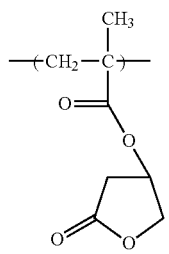

(a2-1-4)
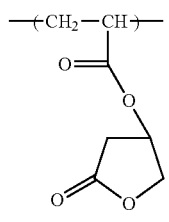

(a2-1-5)
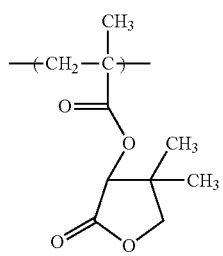

(a2-1-6)
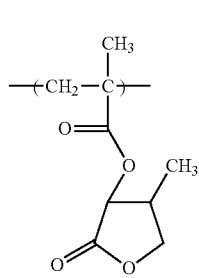

[Chemical Formula 26]

(a2-2-1)
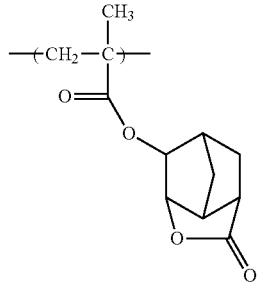

(a2-2-2)
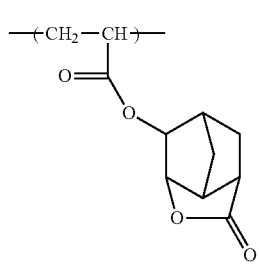

(a2-2-3) 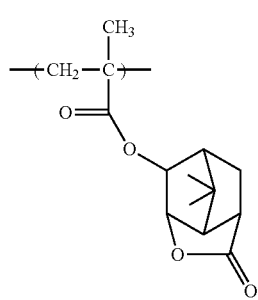
(a2-2-4) 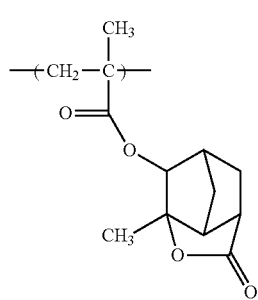
(a2-2-5) 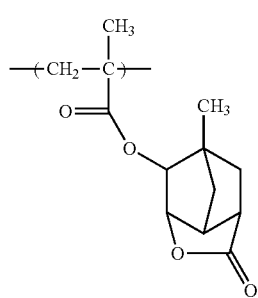
(a2-2-6) 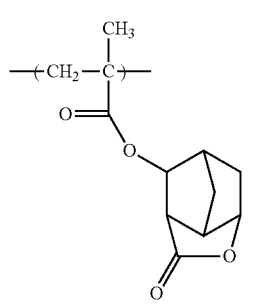
(a2-2-7) 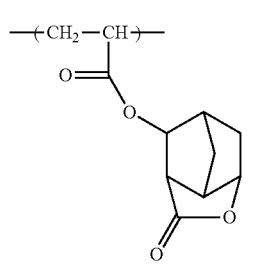
(a2-2-8) 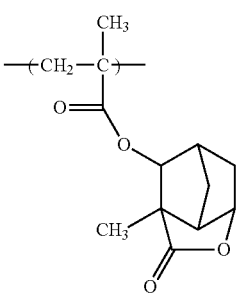
[Chemical Formula 27]
(a2-3-1) 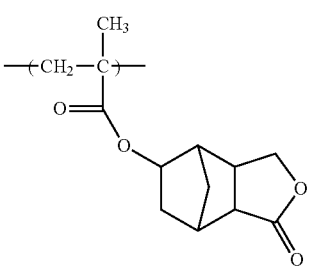
(a2-3-2) 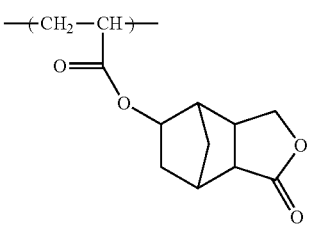
(a2-3-3) 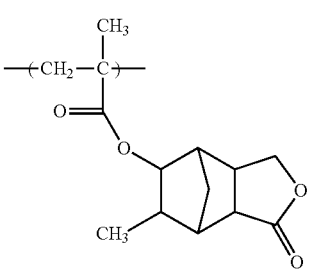
(a2-3-4) 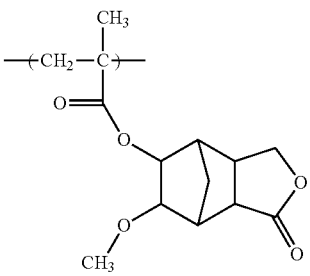
(a2-3-5) 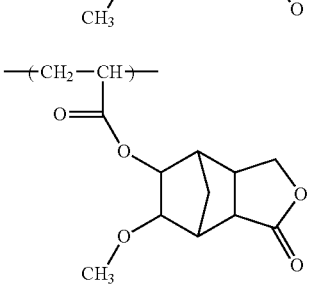

53
-continued
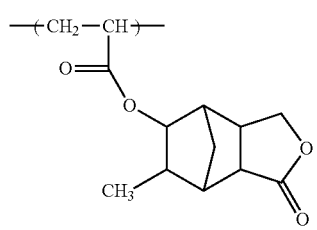
(a2-3-6)
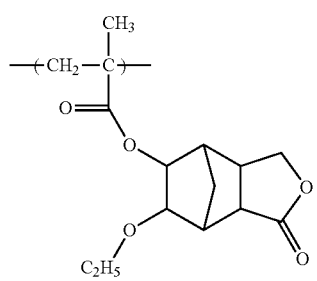
(a2-3-7)
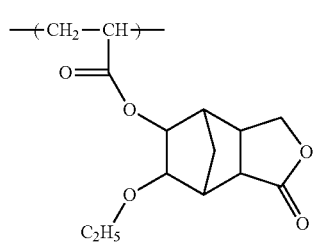
(a2-3-8)
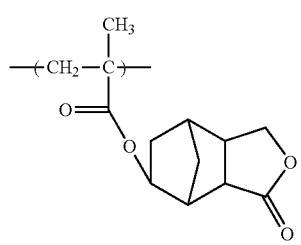
(a2-3-9)
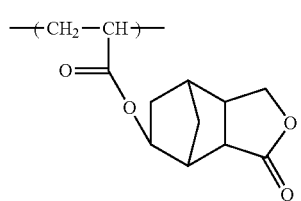
(a2-3-10)
[Chemical Formula 28]
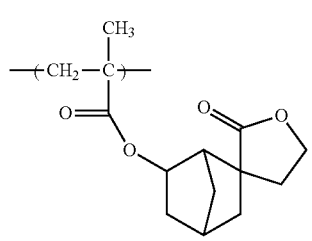
(a2-4-1)
54
-continued
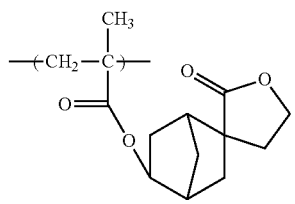
(a2-4-2)
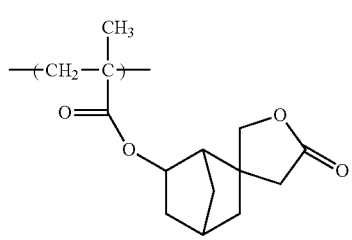
(a2-4-3)
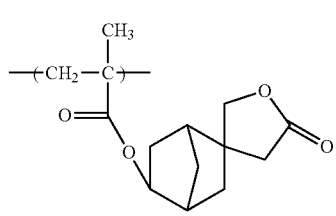
(a2-4-4)
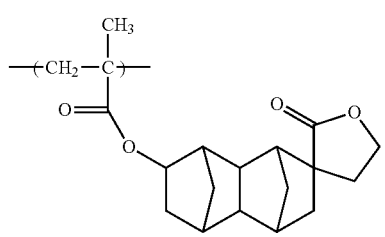
(a2-4-5)
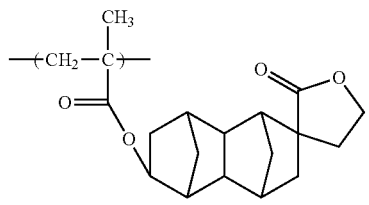
(a2-4-6)
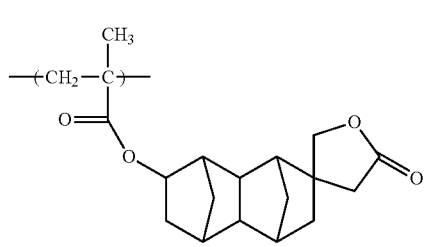
(a2-4-7)
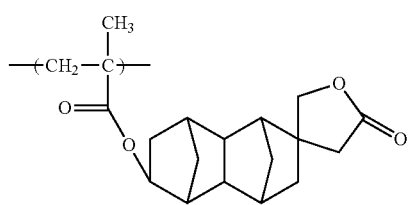
(a2-4-8)

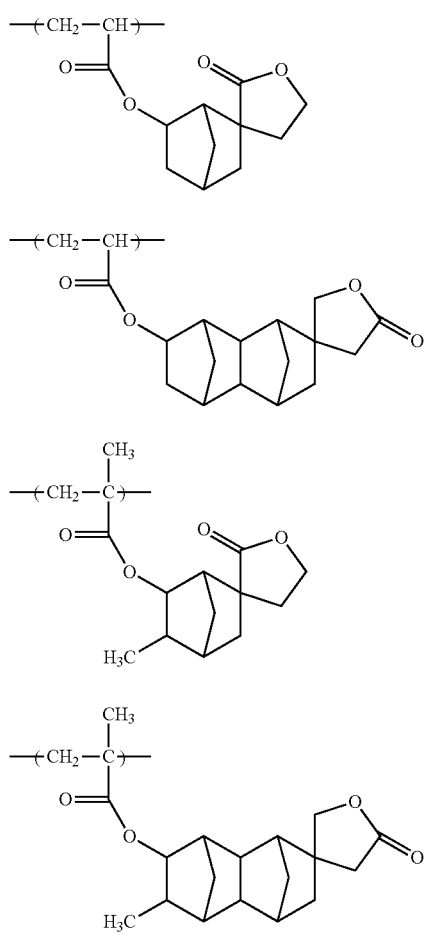

(a2-4-9)
(a2-4-10)
(a2-4-11)
(a2-4-12)

[Chemical Formula 29]

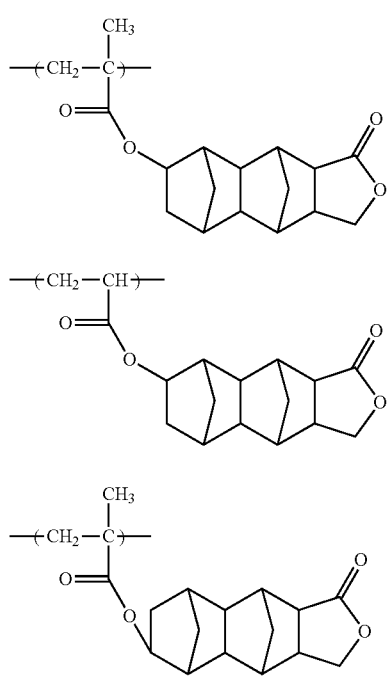

(a2-5-1)
(a2-5-2)
(a2-5-3)

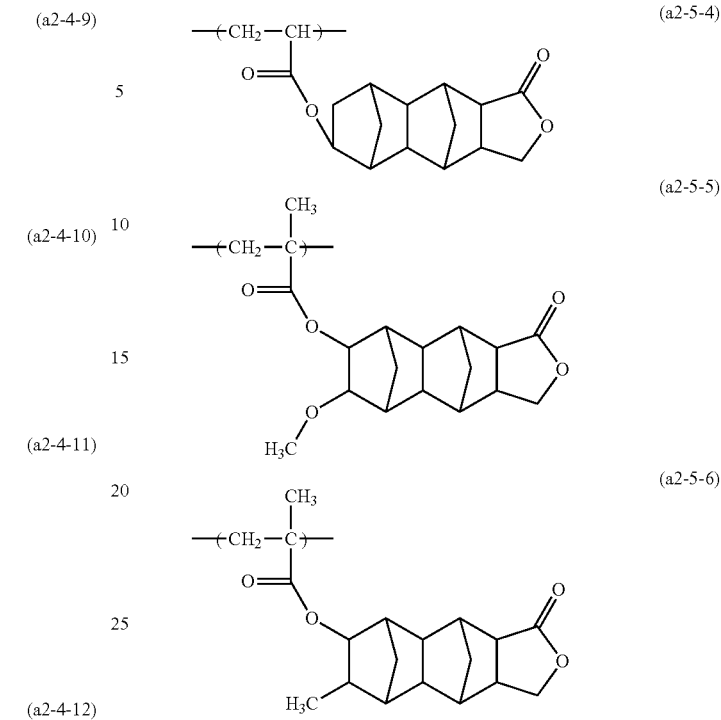

(a2-5-4)
(a2-5-5)
(a2-5-6)

Of these, at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the resin (A1) contained in the positive resist composition, as the structural unit (a2), one type of structural unit may be used, or two or more types may be used in combination.

When the structural unit (a2) is included in the resin (A1), the amount of the structural unit (a2) based on the combined total of all structural units constituting the resin (A1) is preferably 5 to 60 mol %, more preferably 10 to 50 mol %, and still more preferably 20 to 50 mol %. By making the amount of the structural unit (a2) 5 mol % or more, the effect of using the structural unit (a2) can be satisfactorily achieved. On the other hand, by making the amount of the structural unit (a2) no more than 60 mol %, a good balance can be achieved with the other structural units.

Structural Unit (a4)

The component (A1) may also have a structural unit (a4) which is other than the above-mentioned structural units (a0) and (a1) to (a3), as long as the effects of the present invention are not impaired.

As the structural unit (a4), any other structural unit which cannot be classified as one of the above structural units (a0) and (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural units (a1) and (a3), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may have the hydrogen atoms substituted with a linear or branched alkyl group of 1 to 5 carbon atoms.

Specific examples of the structural unit (a4) include units with structures represented by general formulas (a4-1) to (a4-5) shown below.

[Chemical Formula 30]

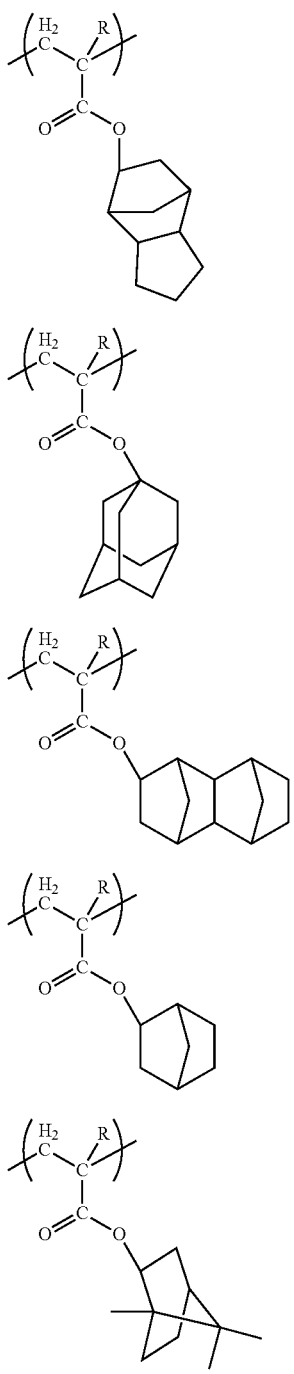

wherein R represents a hydrogen atom, halogen atom, lower alkyl group, or halogenated lower alkyl group.

In general formulas (a4-1) to (a4-5), the halogen atom, lower alkyl group and halogenated lower alkyl group for R are the same as the halogen atom, lower alkyl group or halogenated lower alkyl group which can be bonded to the α-position of the aforementioned acrylate ester.

When the structural unit (a4) is included in the resin (A1), the amount of the structural unit (a4) based on the combined total of all the structural units that constitute the resin (A1) is preferably within the range from 1 to 30 mol %, and more preferably from 10 to 20 mol %.

In the positive resist composition of the present invention, the resin (A1) is a resin having at least the structural unit (a0), and preferably further having the structural unit (a1) and/or the structural unit (a3).

Examples of such a resin include a copolymer having the structural units (a0), (a1) and (a3), a copolymer having the structural units (a0) and (a1), a copolymer having the structural units (a0) and (a3), and copolymers which have these structural units and other structural unit(s).

Examples of such copolymers include a copolymer consisting of structural units (a0), (a1) and (a3), and a copolymer consisting of structural units (a0), (a1) and (a2).

In the positive resist composition of the present invention, as the resin (A1), the combinations of structural units represented by formulas (A1-11) to (A1-16) are particularly desirable.

[Chemical Formula 31]

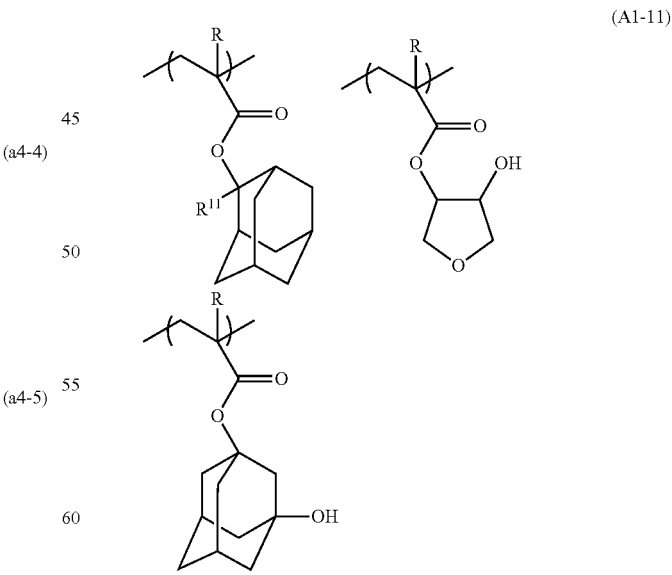

(A1-11)

wherein R represents a hydrogen atom, halogen atom, lower alkyl group, or halogenated lower alkyl group; and $R^{11}$ represents a lower alkyl group.

[Chemical Formula 32]

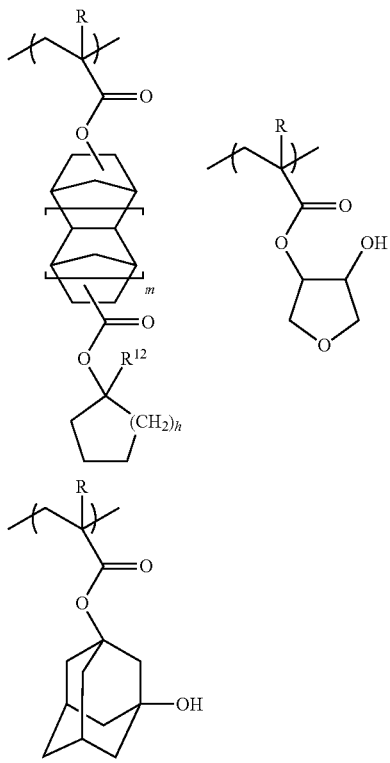

(A1-12)

wherein R represents a hydrogen atom, halogen atom, lower alkyl group, or halogenated lower alkyl group; $R^{12}$ represents a lower alkyl group; m represents 0 or 1; and h represents an integer of 1 to 3.

[Chemical Formula 33]

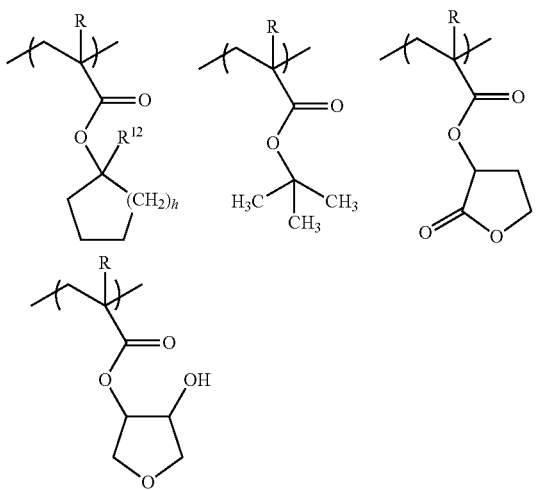

(A1-13)

wherein R represents a hydrogen atom, halogen atom, lower alkyl group, or halogenated lower alkyl group; $R^{12}$ represents a lower alkyl group; and h represents an integer of 1 to 3.

[Chemical Formula 34]

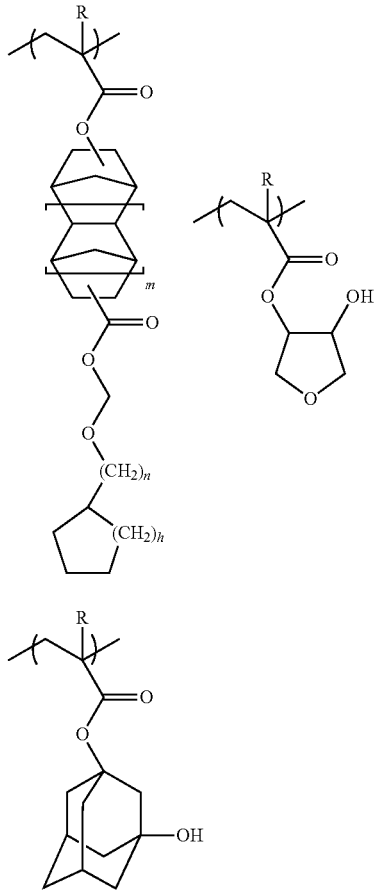

(A1-14)

wherein R represents a hydrogen atom, halogen atom, lower alkyl group, or halogenated lower alkyl group; m represents 0 or 1; n represents an integer of 0 to 3; and h represents an integer of 1 to 3.

[Chemical Formula 35]

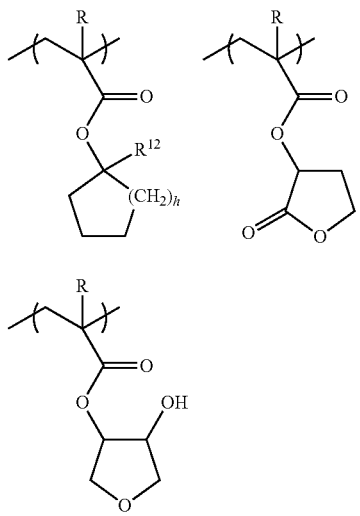

(A1-15)

wherein R represents a hydrogen atom, halogen atom, lower alkyl group, or halogenated lower alkyl group; $R^{12}$ represents a lower alkyl group; and h represents an integer of 1 to 3.

[Chemical Formula 36]

(A1-16)

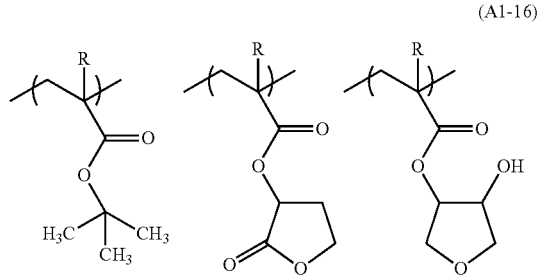

wherein R represents a hydrogen atom, halogen atom, lower alkyl group, or halogenated lower alkyl group The weight average molecular weight (Mw) (the polystyrene equivalent value determined by gel permeation chromatography) of the resin (A1) contained in the positive resist composition is not particularly limited, but is preferably 2,000 to 50,000, more preferably 3,000 to 30,000, and most preferably 5,000 to 20,000. By making the weight average molecular weight no more than the upper limit of the above-mentioned range, the component (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A'), as the resin (A1), one type of resin may be used, or two or more types may be used in combination.

When two or more types of resins are used in combination as the resin (A1), it is preferable to use the resin (A1-15) represented by formula (A1-15) above in combination with the resin (A1-16) represented by formula (A1-16) above, as lithography properties such as line width roughness (LWR), collapse margin, MEF and depth of focus (DOF) are improved.

The mixing ratio (weight ratio) of the resin (A1-15) to the resin (A1-16) is not particularly limited, but in consideration of the effects described above, the resin (A1-15):resin (A1-16) mixing ratio is preferably 9:1 to 1:9, more preferably 8:2 to 2:8, and most preferably 7:3 to 3:7. When the mixing ratio is within the above-mentioned range, the lithography properties are further improved.

The component (A') may include polymeric compounds other than the resin (A1) which are known as resins usable for a positive resist composition, such as a hydroxystryene resin, a novolak resin and an acrylic resin.

However, the amount of the resin (A1) within the component (A') is preferably 50% by weight or more, more preferably 70% by weight or more, still more preferably 80% by weight or more, and most preferably 100% by weight.

The resin (A1) can be obtained, for example, by a conventional radical polymerization or the like of the monomers corresponding with each of the structural units, using a radical polymerization initiator such as azobisisobutyronitrile (AIBN) or dimethyl-2,2'-azobis(2-methylpropionate).

Furthermore, in the resin (A1), by using a chain transfer agent such as HS—$CH_2$—$CH_2$—$CH_2$—$C(CF_3)_2$—OH, a —$C(CF_3)_2$—OH group can be introduced at the terminals of the resin (A1). Such a resin having introduced a hydroxyalkyl group in which some of the hydrogen atoms of the alkyl group are substituted with fluorine atoms is effective in reducing developing defects and LER (line edge roughness: unevenness of the side walls of a line pattern).

Moreover, the component (A') can be obtained by mixing the resins obtained by the above-mentioned method.

The weight average molecular weight (Mw) (the polystyrene equivalent value determined by gel permeation chromatography) of the component (A') is not particularly limited, but is preferably 2,000 to 50,000, more preferably 3,000 to 30,000, and most preferably 5,000 to 20,000. By making the weight average molecular weight no more than the upper limit of the above-mentioned range, the component (A') exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) of the component (A') is preferably 1.0 to 5.0, more preferably 1.0 to 3.0, and most preferably 1.2 to 2.5.

In the positive resist composition of the present invention, the amount of the component (A') can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Examples of onium salt-based acid generators include compounds represented by general formula (b-0) shown below.

[Chemical Formula 37]

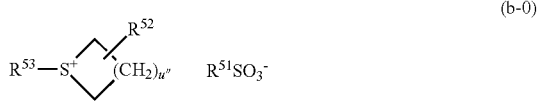

(b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

The fluorination ratio of the fluorinated alkyl group (percentage of the number of fluorine atoms substituting the hydrogen atoms within the alkyl group, based on the total number of hydrogen atoms within the alkyl group prior to fluorination) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same as the linear or branched alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of the substituent include a hydroxyl group and a lower alkyl group (linear or branched, and preferably has 1 to 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be exemplified.

[Chemical Formula 38]

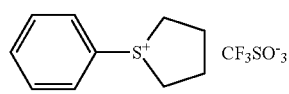

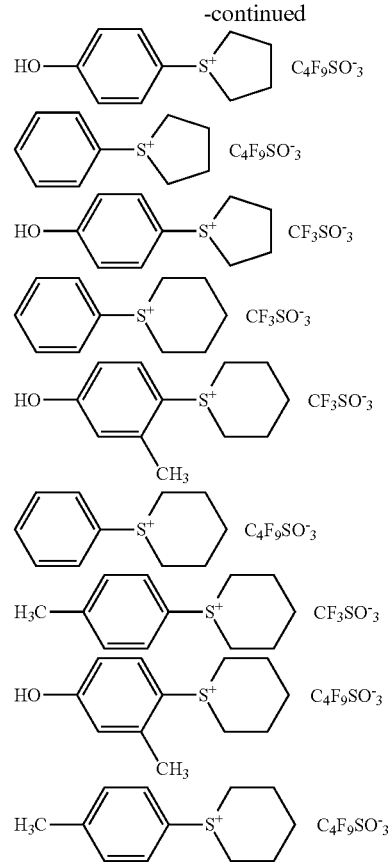

As the acid generator represented by general formula (b-0), one type may be used, or two or more types may be used in combination.

Further, as onium salt-based acid generators other than those represented by general formula (b-0), compounds represented by general formula (b-1) or (b-2) shown below can be preferably used.

[Chemical Formula 39]

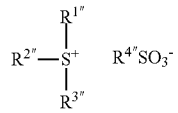

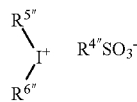

wherein $R^{1''}$ to $R^{3''}$, $R^{5''}$ and $R^{6''}$ each independently represents an aryl group or alkyl group; and $R^{4''}$ represents a linear, branched or cyclic alkyl group or fluorinated alkyl group, with the proviso that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. Among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ be aryl groups.

The aryl group for $R^{1\prime\prime}$ to $R^{3\prime\prime}$ is not specifically limited. For example, an aryl group having 6 to 20 carbon atoms may be used in which some or all of the hydrogen atoms of the aryl group may or may not be substituted with alkyl groups, alkoxy groups or halogen atoms. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ be a phenyl group or a naphthyl group.

$R^{4\prime\prime}$ represents a linear, branched or cyclic alkyl group or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (ratio of fluorine atoms within the alkyl group) is preferably from 10 to 100%, more preferably from 50 to 100%, and it is particularly desirable that all hydrogen atoms are substituted with fluorine atoms because the acid strength increases.

$R^{4\prime\prime}$ is most preferably a linear or cyclic alkyl group or fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same as the aryl groups for $R^{1\prime\prime}$ to $R^{3\prime\prime}$ can be exemplified.

As the alkyl group for $R^{5\prime\prime}$ and $R^{6\prime\prime}$, the same as the alkyl groups for $R^{1\prime\prime}$ to $R^{3\prime\prime}$ can be exemplified.

It is particularly desirable that both of $R^{5\prime\prime}$ and $R^{6\prime\prime}$ represent a phenyl group.

As $R^{4\prime\prime}$ in formula (b-2), the same as those mentioned above for $R^{4\prime\prime}$ in formula (b-1) can be exemplified.

Specific examples of suitable onium salt-based acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) shown below (the cation moiety is the same as (b-1) or (b-2)) may be used.

[Chemical Formula 40]

wherein $X\prime\prime$ represents an alkylene group of 2 to 6 carbon atoms in which at least one hydrogen atom has been substituted with a fluorine atom; and $Y\prime\prime$ and $Z\prime\prime$ each independently represents an alkyl group of 1 to 10 carbon atoms in which at least one hydrogen atom has been substituted with a fluorine atom.

$X\prime\prime$ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

$Y\prime\prime$ and $Z\prime\prime$ each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of $X\prime\prime$ or those of the alkyl group of $Y\prime\prime$ and $Z\prime\prime$ within the range of the number of carbon atoms, the better the solubility in a resist solvent.

Further, in the alkylene group of $X\prime\prime$ or the alkyl group of $Y\prime\prime$ and $Z\prime\prime$, it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 41]

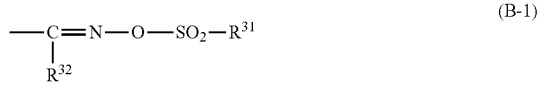

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 42]

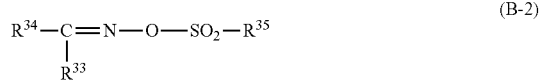

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 43]

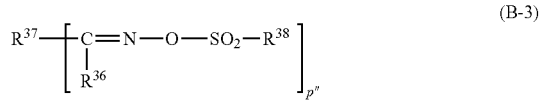

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group for $R^{33}$ preferably has 50% or more of the hydrogen atoms of the alkyl group fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a partially or completely fluorinated alkyl group is more preferable.

In terms of enhancing the strength of the acid generated, the fluorinated alkyl group for $R^{35}$ preferably has 50% or more of the hydrogen atoms of the alkyl group fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxylimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in International Application publication No. WO 2004/074242A2 (Examples 1 to 40 described at pages 65 to 85) may be preferably used.

Furthermore, as preferable examples, the following can be exemplified.

[Chemical Formula 44]

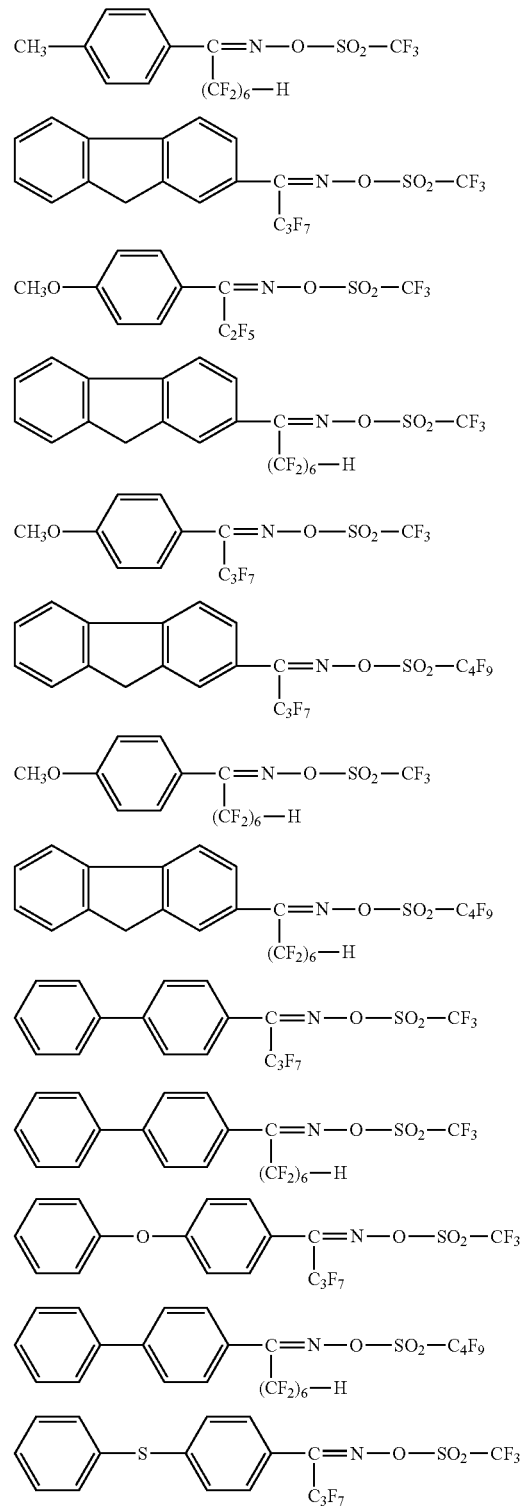

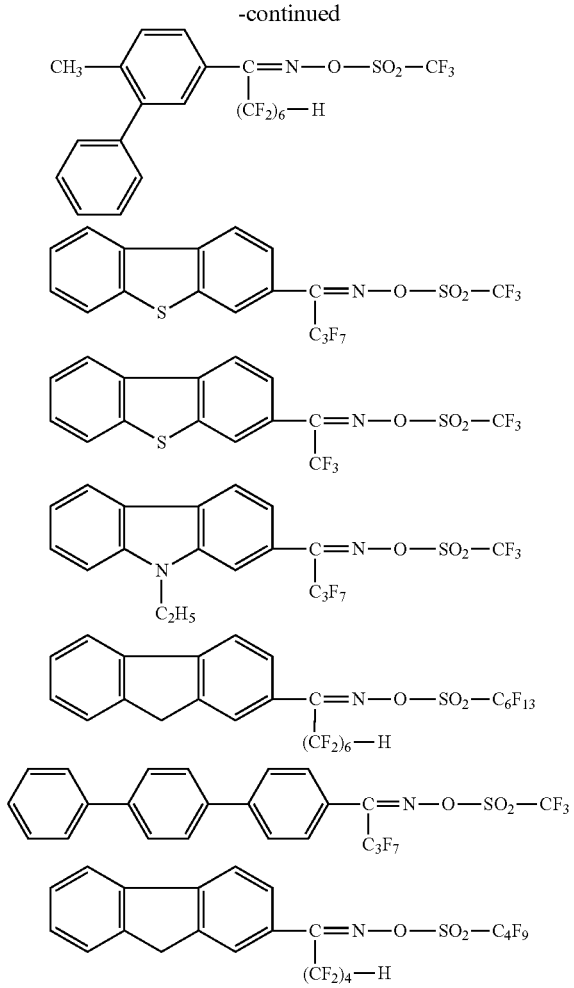

Further, as preferable examples of oxime sulfonate-based acid generators, the following 4 compounds may be exemplified.

[Chemical Formula 45]

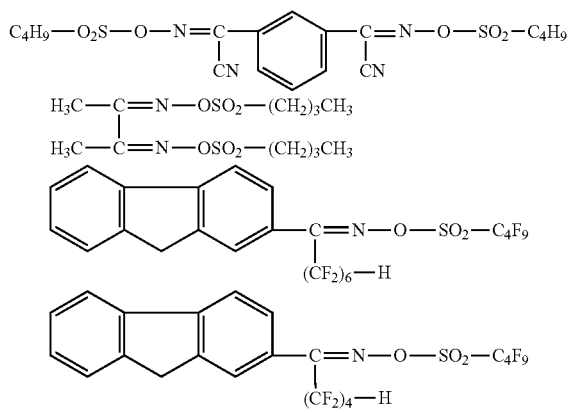

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethyl-sulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyedecane, may be exemplified.

As the component (B), one type of acid generator may be used, or two or more types may be used in combination.

In the present invention, as the component (B), it is preferable to use an onium salt having a fluorinated alkylsulfonic acid ion as the anion moiety. Specific example includes triphenylsulfonium nonafluorobutanesulfonate. Further examples include di(1-naphthyl)phenylsulfonium nonafluorobutanesulfonate and (4-methylphenyl)diphenylsulfonium nonafluorobutanesulfonate.

The amount of the component (B) within the positive resist composition of the present invention is typically 0.5 to 30 parts by weight, and preferably 1 to 15 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

In the positive resist composition of the present invention, for improving the resist pattern shape and the post exposure stability of the latent image formed by the pattern-wise exposure of the resist layer, it is preferable to add a nitrogen-containing organic compound (D) (hereafter referred to as the component (D)) as an optional component.

A multitude of these components (D) have already been proposed, and any of these known compounds may be used, although a cyclic amine, an aliphatic amine, and particularly a secondary aliphatic amine or tertiary aliphatic amine is preferable.

Examples of these aliphatic amines include amines in which at least one hydrogen atom of ammonia ($NH_3$) has been substituted with an alkyl group or hydroxyalkyl group of 1 to 12 carbon atoms (i.e., alkylamines or alkylalcoholamines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkylalcoholamines such as diethanolamine, triethanolamine, diisopropanolamine, triisopropanolamine, di-n-octanolamine, and tri-n-octanolamine.

Among these, alkylalcoholamines and trialkylamines are preferable, and alkylalcoholamines are particularly desirable. Among alkylalcoholamines, triethanolamine and triisopropanolamine are preferable, and triethanolamine is particularly desirable. Among trialkylamines, tri-n-octanolamine is particularly desirable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

In the present invention, it is preferable to use an alkylalcoholamine as the component (D). Specific example includes triethanolamine. It is also preferable to use an alkylamine as the component (D). Specific example includes tri-n-octylamine.

The component (D) is typically used in an amount within a range from 0.01 to 5.0 parts by weight, relative to 100 parts by weight of the component (A).

<Optional Components>

Furthermore, in the positive resist composition of the present invention, for preventing any deterioration in sensitivity, and improving the resist pattern shape and the post exposure stability of the latent image formed by the patternwise exposure of the resist layer, an organic carboxylic acid, or a phosphorus oxo acid or derivative thereof (E) (hereafter referred to as the component (E)) can also be added as another optional component.

Examples of suitable organic carboxylic acids include acetic acid, malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Among these, phosphonic acid is particularly desirable.

As the component (E), one type of compound may be used, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition (i.e., the component (A') (the component (A)), the component (B) and other optional components) in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone methyl isoamyl ketone, and 2-heptanone; polyhydric alcohols and derivatives thereof, such as ethylene glycol, diethylene glycol, propylene glycol and dipropylene glycol; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, amylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

More specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

(Negative Resist Composition)

The negative resist composition of the present invention includes the component (A"), the component (B) and the component (C).

The negative resist composition is alkali soluble prior to exposure, and when acid is generated from the component (B) upon exposure, the acid acts to cause cross-linking between the component (A") and the component (C), and the component (A") becomes alkali insoluble. Therefore, in the formation of a resist pattern, by conducting selective exposure of a resist film formed by using the negative resist composition, the exposed portions become alkali insoluble, whereas the unexposed portions remain alkali soluble, and hence, a negative resist pattern can be formed by alkali developing.

<Component (A")>

In the negative resist composition, the component (A") contains a resin (A1) having a structural unit (a0) represented by general formula (a-0) above.

It is preferable that the resin (A1) consist of the structural unit (a0).

Structural Unit (a0)

The resin (A1) includes a structural unit (a0) represented by general formula (a-0). A negative resist composition using the resin (A1) is capable of forming a resist pattern.

In general formula (a-0), R, a, b and c are the same as in the case of the positive resist composition. Further, the substitution position of the hydroxyl group in general formula (a-0) is the same as in the case of the positive resist composition.

Furthermore, the structural units preferable as the structural unit (a0) are the same as in the case of the positive resist composition.

In the resin (A1) contained in the negative resist composition, as the structural unit (a0), one type of structural unit may be used, or two or more types may be used in combination.

In the resin (A1), the amount of the structural unit (a0) based on the combined total of all structural units constituting the resin (A1) is preferably 50 mol % or more, more preferably 70 mol % or more, and may be even 100 mol %. It is particularly desirable that the amount of the structural unit (a0) be 100 mol %, i.e., the resin (A1) consist of the structural unit (a0). By making the amount of the structural unit (a0) at least as large as the lower limit of the above-mentioned range, the effects of including the structural unit (a0) can be satisfactorily achieved.

The resin (A1) contained in the negative resist composition may also have a structural unit other than the above-mentioned structural unit (a0).

As such a structural unit, a structural unit used in the resin component of a conventional chemically amplified resist composition can be used, and examples thereof include a structural unit containing an aliphatic cyclic group having a fluorinated hydroxyalkyl group, a structural unit derived from an acrylate ester having a hydroxyl group-containing aliphatic cyclic group, and a structural unit derived from an acrylate ester having an alcoholic hydroxyl group on the side chain thereof and no ring structure.

The weight average molecular weight (Mw) (the polystyrene equivalent value determined by gel permeation chromatography) of the resin (A1) contained in the negative resist composition is not particularly limited, but is preferably 2,000 to 30,000, more preferably 2,000 to 10,000, still more preferably 3,000 to 8,000. By making the weight average molecular weight within the above-mentioned range, an excellent dissolution rate to an alkali developing solution can be obtained, and a high resolution can be achieved. Lower weight average molecular weight within the above-mentioned range tends to result in excellent properties.

Further, the dispersity (Mw/Mn) is preferably 1.0 to 5.0, more preferably 1.0 to 2.5.

The resin (A1) can be obtained, for example, by a conventional radical polymerization of the monomers corresponding with each of the structural units.

In the component (A"), as the resin (A1), one type of resin may be used, or two or more types may be used in combination.

The component (A") may include polymeric compounds other than the resin (A1) which are known as resins usable for a negative resist composition, such as a hydroxystyrene resin, a novolak resin and an acrylic resin.

However, the amount of the resin (A1) within the component (A") is preferably 50% by weight or more, more preferably 70% by weight or more, still more preferably 80% by weight or more, and most preferably 100% by weight.

<Component (B)>

The component (B) is the same as in the positive resist composition described above.

In the negative resist composition of the present invention, as the component (B), it is preferable to use an onium salt having a fluorinated alkylsulfonic acid ion as the anion. Specific example includes triphenylsulfonium trifluoromethanesulfonate.

The amount of the component (B) within the negative resist composition of the present invention is typically 0.5 to 30 parts by weight, and preferably 1 to 15 parts by weight, relative to 100 parts by weight of the component (A"). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (C)>

There are no particular limitations on the component (C), which may be selected appropriately from the various cross-linking agents used in conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a mixture of formaldehyde and a lower alcohol of 1 to 5 carbon atoms, thereby substituting a hydrogen atom of the amino group with a hydroxymethyl group or a lower alkoxymethyl group of 1 to 5 carbon atoms.

Of these compounds, those that use melamine are referred to as melamine-based cross-linking agents, those that use urea are referred to as urea-based cross-linking agents, those that use an alkylene urea such as ethylene urea and propylene urea are referred to as alkylene urea-based cross-linking agents, and those that use glycoluril are referred to as glycoluril-based cross-linking agents.

As the component (C), at least one compound selected from the group consisting of melamine-based cross-linking agents, urea-based cross-linking agents, alkylene urea-based cross-linking agents and glycoluril-based cross-linking agents is preferred. Of these, glycoluril-based cross-linking agents are particularly preferable.

Examples of the melamine-based cross-linking agents include compounds produced by reacting melamine and formaldehyde, thereby substituting a hydrogen atom of the amino group with a hydroxymethyl group, and compounds produced by reacting melamine, formaldehyde, and a lower alcohol of 1 to 5 carbon atoms, thereby substituting a hydrogen atom of the amino group with a lower alkoxymethyl group. Specific examples thereof include hexamethoxymethylmelamine, hexaethoxymethylmelamine, hexapropoxymethylmelamine, and hexabutoxybutylmelamine. Of these, hexamethoxymethylmelamine is preferred.

Examples of the urea-based cross-linking agents include compounds produced by reacting urea and formaldehyde, thereby substituting a hydrogen atom of the amino group with a hydroxymethyl group, and compounds produced by reacting urea, formaldehyde, and a lower alcohol of 1 to 5 carbon atoms, thereby substituting a hydrogen atom of the amino group with a lower alkoxymethyl group of 1 to 5 carbon atoms. Specific examples thereof include bismethoxymethylurea, bisethoxymethylurea, bispropoxymethylurea, and bisbutoxymethylurea. Of these, bismethoxymethylurea is preferred.

Examples of the alkylene urea-based cross-linking agents include compounds represented by a general formula (C-1) shown below.

[Chemical Formula 46]

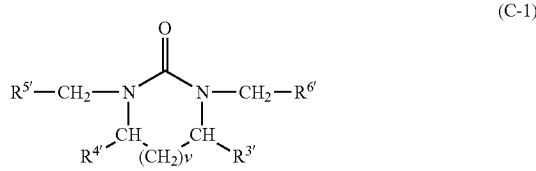

(C-1)

(wherein $R^{5'}$ and $R^{6'}$ each independently represents a hydroxyl group or a lower alkoxy group; $R^{3'}$ and $R^{4'}$ each independently represents a hydrogen atom, a hydroxyl group or a lower alkoxy group; and v is 0, or an integer of 1 or 2.)

When each of $R^{5'}$ and $R^{6'}$ is a lower alkoxy group, the alkoxy group preferably has 1 to 4 carbon atoms, and may be either a linear or branched group. $R^{5'}$ and $R^{6'}$ may be the same, or may be different from each other. More preferably, $R^{5'}$ and $R^{6'}$ are the same.

When each of $R^{3'}$ and $R^{4'}$ is a lower alkoxy group, the alkoxy group preferably has carbon atoms of 1 to 4, and may be either a linear or branched group. $R^{3'}$ and $R^{4'}$ may be the same, or may be different from each other. More preferably, $R^{3'}$ and $R^{4'}$ are the same.

v is 0 or an integer of 1 or 2, and preferably 0 or 1.

It is particularly desirable that the alkylene urea-based cross-linking agent is a compound in which v is 0 (ethylene urea-based cross-linking agent) and/or a compound in which v is 1 (propylene urea-based cross-linking agent).

The compounds represented by general formula (C-1) shown above can be obtained by the condensation reaction of alkylene urea and formaldehyde, or by the reaction of the thus obtained condensation product with a lower alcohol of 1 to 5 carbon atoms.

Specific examples of the alkylene urea-based cross-linking agents include ethylene urea-based cross-linking agents such as mono- and/or dihydroxymethylated ethylene urea, mono- and/or dimethoxymethylated ethylene urea, mono- and/or diethoxymethylated ethylene urea, mono- and/or dipropoxymethylated ethylene urea, and mono- and/or di-butoxymethylated ethylene urea; propylene urea-based cross-linking agents such as mono- and/or dihydroxymethylated propylene urea, mono- and/or dimethoxymethylated propylene urea, mono- and/or diethoxymethylated propylene urea, mono- and/or dipropoxymethylated propylene urea, and mono- and/or dibutoxymethylated propylene urea; 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linking agents include glycoluril derivatives in which the N-position is substituted with a hydroxyalkyl group and/or an alkoxyalkyl group of 1 to 4 carbon atoms. Such glycoluril derivatives can be obtained by the condensation reaction of glycoluril and formaldehyde, or by the reaction of the product thus obtained with a lower alcohol of 1 to 5 carbon atoms.

Specific examples of the glycoluril-based cross-linking agents include mono-, di-, tri- and/or tetrahydroxymethylated glycoluril, mono-, di-, tri- and/or tetramethoxymethylated glycoluril, mono-, di-, tri- and/or tetraethoxymethylated glycoluril, mono-, di-, tri- and/or tetrapropoxymethylated glycoluril, and mono-, di-, tri- and/or tetrabutoxymethylated glycoluril.

The component (C) can be used either alone or in combination of two or more different cross-linking agents.

The amount of the component (C) is preferably within a range from 3 to 30 parts by weight, more preferably from 3 to 15 parts by weight, and most preferably from 5 to 10 parts by weight, relative to 100 parts by weight of the component (A"). By making the amount of the component (C) 3 parts by weight or more, a cross-linking formation progresses adequately, and an excellent resist pattern can be obtained. On the other hand, by making the amount of the component (C) no more than 30 parts by weight, an excellent storage stability of the resist coating solution can be obtained, and deterioration of sensitivity with lapse of time can be suppressed.

<Component (D)>

In the negative resist composition of the present invention, for improving the resist pattern shape and the post exposure stability of the latent image formed by the pattern-wise exposure of the resist layer, it is preferable to add a nitrogen-containing organic compound (D) (hereafter referred to as the component (D)) as an optional component.

The component (D) is the same as the component (D) in the positive resist composition described above.

In the negative resist composition of the present invention, as the component (D), an alkylalcoholamine is preferable, and triethanolamine or triisopropanolamine is particularly desirable.

In the negative resist composition of the present invention, the amount of the component (D) is typically 0.01 to 5.0 parts by weight, relative to 100 parts by weight of the component (A").

<Optional Components>

In the negative resist composition of the present invention, as optional components, the same components as those described above for the positive resist composition can be added, such as the component (E), the component (S), and if desired, other miscible additives including additive resins for improving the performance of the resist film, surfactants for improving the applicability, dissolution inhibitors, plasticizers, stabilizers, colorants, halation prevention agents, and dyes.

As the component (S), in consideration of the solubility of the component (A"), propylene glycol monomethyl ether (PGME) is particularly desirable.

The amount of the component (S) is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

<<Method of Forming a Resist Pattern>>

The method of forming a resist pattern according to the present invention includes applying a positive or negative resist composition of the present invention to a substrate to form a resist film on the substrate; conducting exposure of the resist film; and alkali-developing the resist film to form a resist pattern.

More specifically, the method for forming a resist pattern according to the present invention can be performed, for example, as follows.

Firstly, a resist composition of the present invention is applied onto a substrate such as a silicon wafer using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

A post bake step may be performed after the alkali developing. Further, an organic or inorganic anti-reflective film may also be provided between the substrate and the applied layer of the resist composition.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is particularly effective to ArF excimer laser.

<<Resin>>

The resin of the present invention includes a structural unit (a0) represented by general formula (a-0) above. The structural unit (a0) is preferably 3-methacryloyloxy-4-hydroxytetrahydrofuran.

The resin is preferable as a resin for a resist. The resin is the same as the aforementioned resin (A1), and explanation thereof will be omitted.

By the present invention, a novel resist composition can be provided. The function of the structural unit (a0) represented by general formula (a-0) above is presumed as follows.

In a positive resist composition, it is presumed that the structural unit (a0) exhibits the function of adjusting the alkali solubility of the component (A') at exposed portions. As a result, it is presumed that the positive resist composition is capable of forming an extremely fine resist pattern.

The structural unit (a0) has a hydroxyl group, and has a monocyclic group including an oxygen atom in the ring skeleton. Thus, it is presumed that the structural unit has a high polarity, and exhibits excellent affinity for a developing solution. Therefore, it is presumed that the component (A') rapidly dissolves in the alkali developing solution at exposed portions. Further, it is presumed that the component (A') at unexposed portions exhibit improved adhesion to a substrate by the action of the hydroxyl group within the structural unit (O).

In the negative resist composition, as the structural unit (a0) has a hydroxyl group, it is presumed that the structural unit (a0) causes cross linking with the cross-linker component, thereby adjusting the alkali insolubility of the component (A") at exposed portions. As a result, it is presumed that the negative resist composition is capable of forming an extremely fine resist pattern.

Further, as the hydroxyl group within the structural unit (a0) is bonded to the monocyclic group, it is presumed that the influence of steric hindrance on the crosslinkability with the cross-linker component is small. Therefore, it is presumed that the crosslinkability is high, and alkali insolubilizing of the component (A") at exposed portions is excellent. Further, for the same reason as in the exposed portions of the positive resist composition, it is presumed that the component (A") at unexposed portions is rapidly dissolved in an alkali developing solution. As a result, the negative resist composition exhibits excellent lithography properties such as excellent resolution.

Furthermore, according to the present invention, the positive resist composition is capable of forming a resist pattern with an excellent shape, for example, reduced line width roughness (LWR) which indicates the non-uniformity of the line width of a line pattern. The positive resist composition is preferably capable of forming a resist pattern with an excellent shape on a thin resist film.

Furthermore, according to the present invention, the positive resist composition can achieve excellent mask error factor (MEF) and excellent exposure margin.

The exposure margin is the variation in the pattern size depending on the change in the exposure dose. The larger the exposure margin, the smaller the variation in the pattern size depending on the change in the exposure dose.

Furthermore, according to the present invention, the positive resist composition exhibits excellent lithography properties such as excellent collapse margin and depth of focus (DOF).

The "collapse margin" indicates the unsusceptibility of a resist pattern to pattern collapse when an extremely fine resist pattern is resolved.

The "DOF" is the range of depth of focus in which a resist pattern having a predetermined size within the range corresponding to the target size can be formed when the exposure focus is moved upwardly or downwardly with the same exposure dose, i.e., the range in which a resist pattern faithful to the mask pattern can be obtained. Larger DOF is more preferable.

EXAMPLES

As follows is a description of examples of the present invention, although the scope of the present invention is by no way limited by these examples.

Synthesis Examples

The monomer for deriving the structural unit (a0) according to the present invention, which was used in the synthesis of the resin component (A) used in Examples, is shown below.

HOTHFMA: monomer represented by chemical formula shown below (3-methacryloyloxy-4-hydroxytetrahydrofuran)

[Chemical Formula 47]

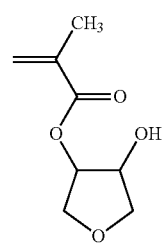

The synthesizing method of the monomer is described below. In the Synthesis Examples, gas chromatography (GC) was performed using a capillary column TG-1 (manufactured by GL Science) (inner diameter: 0.25 mm, column length: 30 m, film thickness: 0.25 μm, carrier gas: helium), and gel permeation chromatography (GPC) was performed using two columns in series (product name: TSK-GEL G2000-H$_{XL}$; manufactured by Tosoh Corporation) (inner diameter: 7.8 mm, column length: 300 mm, transfer phase: THF, column temperature: 40° C.).

Synthesis Example 1

Into a reaction vessel having nitrogen flowing therethrough were charged 20.00 g (192 mmol) of cis-3,4-dihydroxytetrahydrofuran, 15.50 g (153 mmol, 0.797 equivalent of cis-3,4-dihydroxytetrahydrofuran) of triethylamine and 150 ml of tetrahydrofuran (THF), and the reaction system was cooled to −5° C. with salt/ice.

13.79 g (128 mmol, 0.666 equivalent of cis-3,4-dihydroxytetrahydrofuran) of methacrylic acid chloride (purity: 97% by weight) was gradually added to the reaction vessel over 60 minutes in a dropwise manner. Then, the temperature was gradually elevated to 20° C., and the reaction was continued for 1 hour. After completion of the reaction, the reaction liquid was added to 20 ml of saturated sodium hydrogencarbonate water, and THF was distilled off using a rotary evaporator. The remaining water phase was extracted with 50 ml of ethyl acetate three times. The ethyl acetate phase was washed with 20 ml of 1N aqueous HCl solution once, 20 ml of saturated sodium hydrogencarbonate water twice, and 20 ml of saturated saline solution twice, followed by drying with magnesium sulfate. After drying, ethyl acetate was distilled using a rotary evaporator, thereby obtaining 15.75 g of a yellow oily substance.

The obtained substance was dissolved in a mixed solution of 140 ml of water and 70 ml of methanol, and extracted with 70 ml of heptane five times. Then, the water/methanol phase was extracted with 50 ml of ethyl acetate three times, and the ethyl acetate phase was collected and dried with magnesium sulfate. After drying, ethyl acetate was distilled using a rotary evaporator, thereby obtaining 9.50 g of a crude 3-methacryloyloxy-4-hydroxytetrahydrofuran in the form of a colorless oily substance (yield in terms of methacrylic acid chloride: 43.1% by weight). The obtained substance was distilled using a thin film evaporation apparatus in which the temperature of the volatilization portion was set at 98° C.

From the distillate portion of the thin film evaporation apparatus, 7.46 g of a purified 3-methacryloyloxy-4-hydroxytetrahydrofuran was obtained in the form of a colorless oily substance (yield in terms of methacrylic acid chloride: 33.9% by weight, GC purity: 99% by weight, GPC purity: 99% by weight).

The results of instrumental analysis (proton nuclear magnetic resonance spectrum, carbon 13 nuclear magnetic resonance spectrum and results of gas chromatography analysis) of the product are shown below.

(1H-NMR (400 MHz), CDCl$_3$, in ppm); 6.19 (1H, brs), 5.66 (1H, brs), 5.21 (1H, br dd), 4.50 (1H, br ddd), 4.12 (1H, dd), 4.00 (1H, dd), 3.88 (1H, dd), 3.75 (1H, dd), 2.12 (1H, brs, OH), 1.98 (3H, s, Me).

(13C-NMR (100 MHz), CDCl$_3$, in ppm); 166.96, 135.59, 126.72, 73.97, 72.39, 71.08, 70.56, 18.26.
GC-mass (measured after conversion into TMS (conversion into derivative), CI method (chemical ionization method)); M+TMS=245.

From the results of analysis shown above, it was confirmed that the product was 3-methacryloyloxy-4-hydroxytetrahydrofuran.

Using monomers (1) to (9) shown below, resins (A)-1 to (A)-13 were synthesized. The weight average molecular weight (Mw), dispersity (Mw/Mn) and compositional ratio (molar ratio) of each of the resins are shown in Table 1.

The weight average molecular weight (Mw) and dispersity (Mw/Mn) were determined by the polystyrene equivalent value as measured by gel permeation chromatography (GPC). Further, the compositional ratio was determined by carbon NMR. In the chemical formulas, the subscript numerals of the respective structural units indicate the percentage (mol %) of the respective structural units within the polymer.

[Chemical Formula 48]

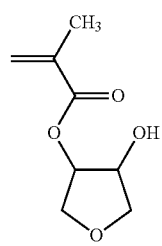

(1)

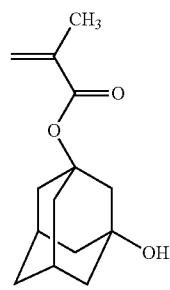

(2)

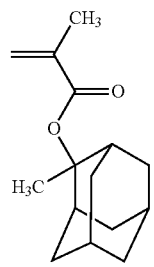

(3)

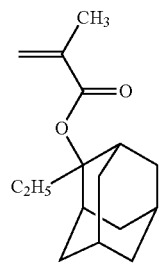

(4)

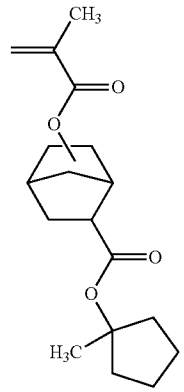

(5)

-continued (6)
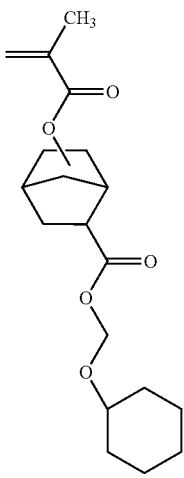

(7)
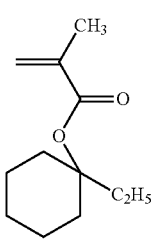

(8)
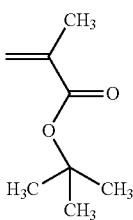

(9)
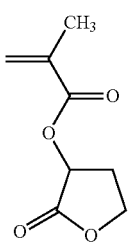

Synthesis Example 2

10 g of the compound (1), 200 ml of tetrahydrofuran (THF) and 0.6 g of a polymerization initiator (product name: V-601, manufactured by Wako Pure Chemical Industries, Ltd.) were added and mixed in a flask purged with nitrogen and equipped with an inlet for nitrogen, a stirrer, a condenser and a thermometer, and refluxed for 6 hours. Then, the reaction solution was dropwise added to an excess amount of heptane while stirring. The resulting precipitate was separated by filtration, and dried under reduced pressure, thereby obtaining a resin (A)-1 (chemical formula shown below).

[Chemical Formula 49]

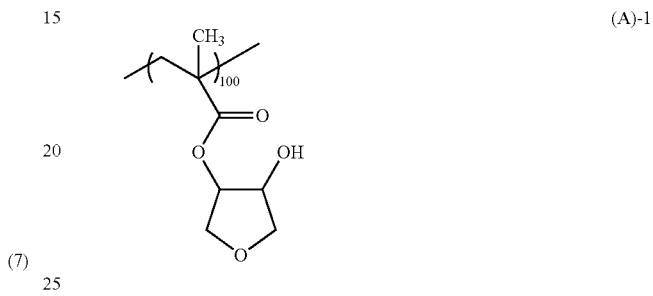

(A)-1

Synthesis Example 3

70 g of THF was charged into a flask purged with nitrogen and equipped with an inlet for nitrogen, a stirrer, a condenser and a thermometer, and the temperature of water bath was elevated to 80° C. while stirring. 27.6 g of the compound (1), 18.9 g of the compound (2), 37.5 g of the compound (3), 126 g of THF and 3.2 g of a polymerization initiator (product name: V-601, manufactured by Wako Pure Chemical Industries, Ltd.) were mixed together to obtain a monomer solution, and the obtained monomer solution was dropwise added to the flask at a constant rate over 6 hours using a dispensing apparatus. The resultant was maintained at 80° C. for 1 hour. Thereafter, the reaction solution was dropwise added to an excess amount of heptane while stirring. The resulting precipitate was separated by filtration, and dried under reduced pressure, thereby obtaining a resin (A)-2 (chemical formula shown below).

[Chemical Formula 50]

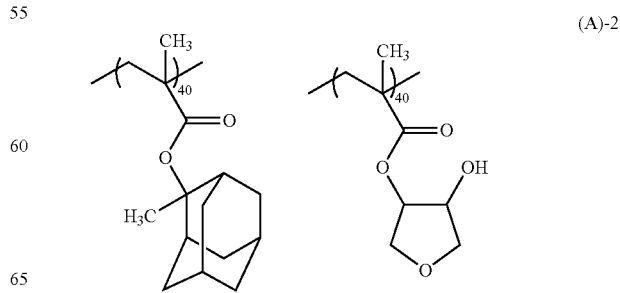

(A)-2

-continued

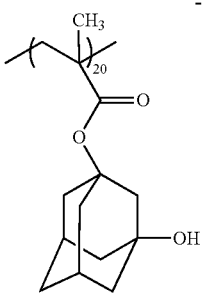

Synthesis Example 4

71 g of THF was charged into a flask purged with nitrogen and equipped with an inlet for nitrogen, a stirrer, a condenser and a thermometer, and the temperature of water bath was elevated to 80° C. while stirring. 27.6 g of the compound (1), 18.9 g of the compound (2), 39.7 g of the compound (4), 129 g of THF and 3.2 g of a polymerization initiator (product name: V-601, manufactured by Wako Pure Chemical Industries, Ltd.) were mixed together to obtain a monomer solution, and the obtained monomer solution was dropwise added to the flask at a constant rate over 6 hours using a dispensing apparatus. The resultant was maintained at 80° C. for 1 hour. Thereafter, the reaction solution was dropwise added to an excess amount of heptane while stirring. The resulting precipitate was separated by filtration, and dried under reduced pressure, thereby obtaining a resin (A)-3 (chemical formula shown below).

[Chemical Formula 51]

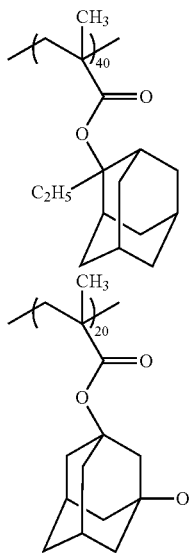

Synthesis Example 5

80 g of THF was charged into a flask purged with nitrogen and equipped with an inlet for nitrogen, a stirrer, a condenser and a thermometer, and the temperature of water bath was elevated to 80° C. while stirring. 27.6 g of the compound (1), 18.9 g of the compound (2), 49.0 g of the compound (5), 144 g of THF and 3.2 g of a polymerization initiator (product name: V-601, manufactured by Wako Pure Chemical Industries, Ltd.) were mixed together to obtain a monomer solution, and the obtained monomer solution was dropwise added to the flask at a constant rate over 6 hours using a dispensing apparatus. The resultant was maintained at 80° C. for 1 hour. Thereafter, the reaction solution was dropwise added to an excess amount of heptane while stirring. The resulting precipitate was separated by filtration, and dried under reduced pressure, thereby obtaining a resin (A)-4 (chemical formula shown below).

[Chemical Formula 52]

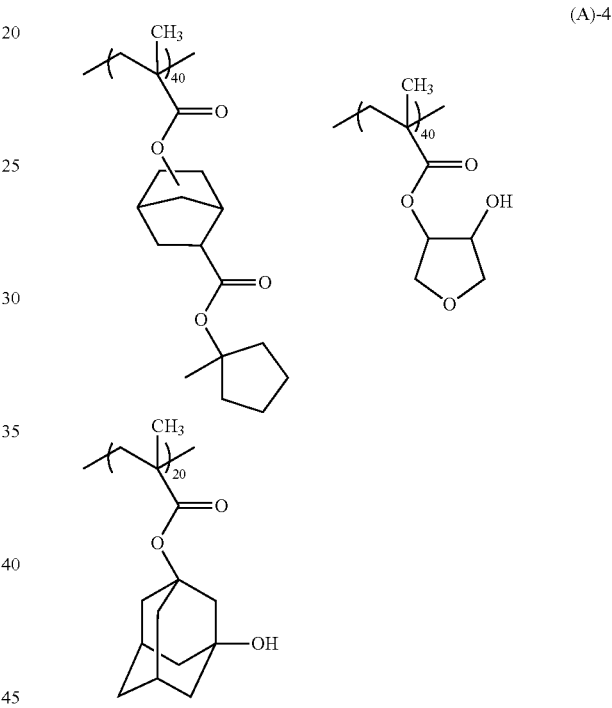

Synthesis Example 6

78 g of THF was charged into a flask purged with nitrogen and equipped with an inlet for nitrogen, a stirrer, a condenser and a thermometer, and the temperature of water bath was elevated to 80° C. while stirring. 34.4 g of the compound (1), 18.9 g of the compound (2), 40.4 g of the compound (6), 141 g of THF and 3.2 g of a polymerization initiator (product name: V-601, manufactured by Wako Pure Chemical Industries, Ltd.) were mixed together to obtain a monomer solution, and the obtained monomer solution was dropwise added to the flask at a constant rate over 6 hours using a dispensing apparatus. The resultant was maintained at 80° C. for 1 hour. Thereafter, the reaction solution was dropwise added to an excess amount of heptane while stirring. The resulting precipitate was separated by filtration, and dried under reduced pressure, thereby obtaining a resin (A)-5 (chemical formula shown below).

[Chemical Formula 53]

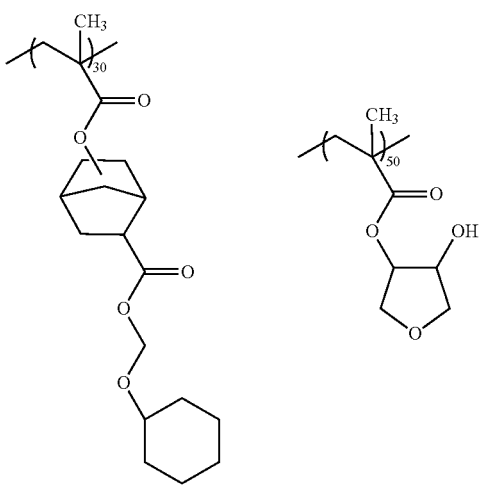

(A)-5

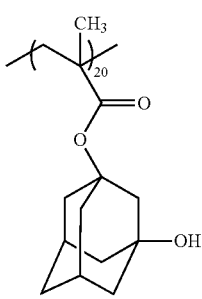

Synthesis Example 7

78 g of THF was charged into a flask purged with nitrogen and equipped with an inlet for nitrogen, a stirrer, a condenser and a thermometer, and the temperature of water bath was elevated to 80° C. while stirring. 34.4 g of the compound (1), 18.9 g of the compound (2), 40.4 g of the compound (6), 141 g of THF and 4.5 g of a polymerization initiator (product name: V-601, manufactured by Wako Pure Chemical Industries, Ltd.) were mixed together to obtain a monomer solution, and the obtained monomer solution was dropwise added to the flask at a constant rate over 6 hours using a dispensing apparatus. The resultant was maintained at 80° C. for 1 hour. Thereafter, the reaction solution was dropwise added to an excess amount of heptane while stirring. The resulting precipitate was separated by filtration, and dried under reduced pressure, thereby obtaining a resin (A)-6 (the same as chemical formula (A)-5 shown above).

Synthesis Example 8

56 g of THF was charged into a flask purged with nitrogen and equipped with an inlet for nitrogen, a stirrer, a condenser and a thermometer, and the temperature of water bath was elevated to 80° C. while stirring. 13.8 g of the compound (1), 15.7 g of the compound (7), 11.4 g of the compound (8), 27.2 g of the compound (9), 102 g of THF and 4.5 g of a polymerization initiator (product name: V-601, manufactured by Wako Pure Chemical Industries, Ltd.) were mixed together to obtain a monomer solution, and the obtained monomer solution was dropwise added to the flask at a constant rate over 6 hours using a dispensing apparatus. The resultant was maintained at 80° C. for 1 hour. Thereafter, the reaction solution was dropwise added to an excess amount of heptane while stirring. The resulting precipitate was separated by filtration, and dried under reduced pressure, thereby obtaining a resin (A)-7 (chemical formula shown below).

[Chemical Formula 54]

(A)-7

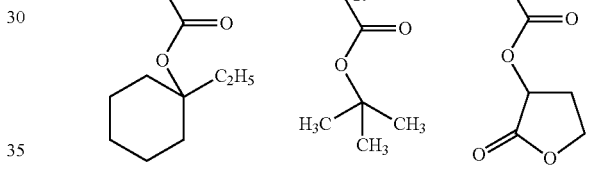

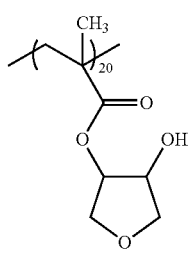

Synthesis Example 9

(Synthesis of Resins (A)-8 to (A)-13)

Resins (A)-8 to (A)-13 were synthesized in substantially the same manner as in the aforementioned Synthesis Examples, except that monomers for deriving the structural units of the respective resins were used in a predetermined molar ratio.

[Chemical Formula 55]

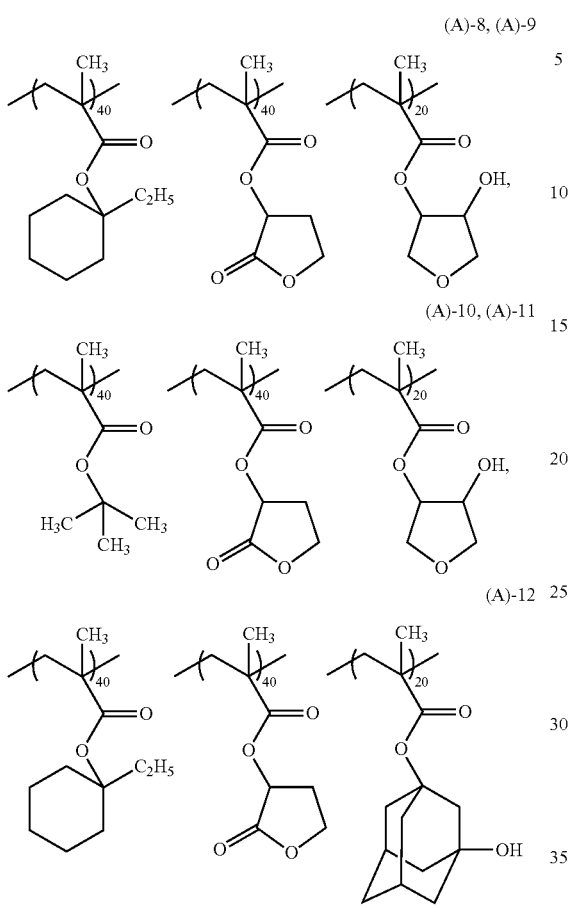

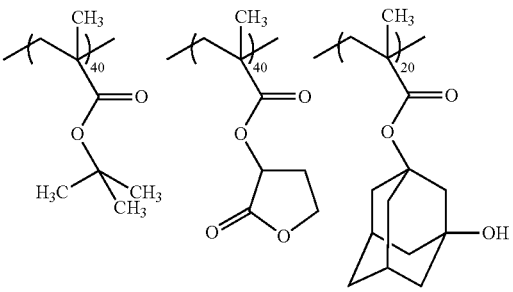

TABLE 1

| | (1) | (2) | (3) | (4) | (5) | (6) | (7) | (8) | (9) | Mw | Mw/Mn |
|---|---|---|---|---|---|---|---|---|---|---|---|
| (A)-1 | 100 | — | — | — | — | — | — | — | — | 4000 | 1.52 |
| (A)-2 | 40 | 20 | 40 | — | — | — | — | — | — | 6700 | 1.79 |
| (A)-3 | 40 | 20 | — | 40 | — | — | — | — | — | 7300 | 1.76 |
| (A)-4 | 40 | 20 | — | — | 40 | — | — | — | — | 7700 | 1.75 |
| (A)-5 | 50 | 20 | — | — | — | 30 | — | — | — | 6900 | 1.68 |
| (A)-6 | 50 | 20 | — | — | — | 30 | — | — | — | 10500 | 1.80 |
| (A)-7 | 20 | — | — | — | — | — | 20 | 20 | 40 | 9900 | 1.66 |
| (A)-8 | 20 | — | — | — | — | — | 40 | — | 40 | 9700 | 1.76 |
| (A)-9 | 20 | — | — | — | — | — | 40 | — | 40 | 7000 | 1.78 |
| (A)-10 | 20 | — | — | — | — | — | — | 40 | 40 | 9700 | 1.54 |
| (A)-11 | 20 | — | — | — | — | — | — | 40 | 40 | 7000 | 1.47 |
| (A)-12 | — | 20 | — | — | — | — | 40 | — | 40 | 10000 | 2.00 |
| (A)-13 | — | 20 | — | — | — | — | — | 40 | 40 | 10000 | 2.00 |

Examples 1 to 11, Comparative Example 1

The components shown in Table 2 were mixed together and dissolved to obtain resist composition solutions (Example 1: negative resist composition, Examples 2-11: positive resist composition, Comparative Example 1: positive resist composition).

TABLE 2

| | (A) | | (B) | | (C) | (D) | (E) | (S) |
|---|---|---|---|---|---|---|---|---|
| Ex. 1 | (A)-1 | — | (B)-1 | — | (C)-1 | (D)-1 | — | (S)-1 |
| | [100] | | [1.5] | | [5.0] | [0.30] | | [1150] |
| Ex. 2 | (A)-2 | — | (B)-2 | — | — | (D)-2 | — | (S)-2 |
| | [100] | | [3.0] | | | [0.35] | | [1150] |
| Ex. 3 | (A)-3 | — | (B)-2 | — | — | (D)-2 | — | (S)-2 |
| | [100] | | [3.0] | | | [0.35] | | [1150] |
| Ex. 4 | (A)-4 | — | (B)-2 | — | — | (D)-2 | — | (S)-2 |
| | [100] | | [3.0] | | | [0.35] | | [1150] |
| Ex. 5 | (A)-2 | — | (B)-2 | — | — | (D)-2 | — | (S)-3 |
| | [100] | | [5.0] | | | [0.50] | | [1900] |
| Ex. 6 | (A)-3 | — | (B)-2 | — | — | (D)-2 | — | (S)-3 |
| | [100] | | [5.0] | | | [0.50] | | [1900] |
| Ex. 7 | (A)-5 | — | (B)-2 | — | — | (D)-2 | — | (S)-3 |
| | [100] | | [5.0] | | | [0.50] | | [1900] |
| Ex. 8 | (A)-6 | — | (B)-2 | — | — | (D)-2 | — | (S)-3 |
| | [100] | | [5.0] | | | [0.50] | | [1900] |
| Ex. 9 | (A)-7 | — | (B)-2 | — | — | (D)-2 | — | (S)-3 |
| | [100] | | [5.0] | | | [0.50] | | [1900] |
| Ex. 10 | (A)-8 | (A)-10 | (B)-3 | (B)-4 | — | (D)-3 | (E)-1 | (S)-3 |
| | [50] | [50] | [7.0] | [1.0] | | [1.20] | [0.50] | [1550] |
| Ex. 11 | (A)-9 | (A)-11 | (B)-3 | (B)-4 | — | (D)-3 | (E)-1 | (S)-3 |
| | [50] | [50] | [7.0] | [1.0] | | [1.20] | [0.50] | [1550] |
| Comp. Ex. 1 | (A)-12 | (A)-13 | (B)-3 | (B)-4 | — | (D)-3 | (E)-1 | (S)-3 |
| | [50] | [50] | [7.0] | [1.0] | | [1.20] | [0.50] | [1550] |

In Table 2, the reference characters indicate the following. Further, the values in brackets [ ] indicate the amount (in terms of parts by weight) of the component added.

(B)-1: triphenylsulfonium trifluoromethanesulfonate
(B)-2: triphenylsulfonium nonafluorobutanesulfonate
(B)-3: di(1-naphthyl)phenylsulfonium nonafluorobutanesulfonate
(B)-3: (4-methylphenyl)diphenylsulfonium nonafluorobutanesulfonate
(C)-1: tetramethoxymethylated glycoluril (product name: MX270, manufactured by Sanwa Chemical Co., Ltd.)
(D)-1: triisopropanolamine
(D)-2: triethanolamine
(D)-3: tri-n-octylamine
(E)-1: salicylic acid
(S)-1: propylene glycol monomethyl ether (PGME)
(S)-2: a mixed solvent of PGMEA/EL=8/2 (weight ratio)
(S)-3: a mixed solvent of PGMEA/PGME=6/4 (weight ratio)

Using the resist composition solutions of Examples 1 to 9, the following evaluations were performed.

[Formation of Resist Pattern]

An organic anti-reflection film composition (product name: ARC29, manufactured by Brewer Science Ltd.) was uniformly applied onto a silicon wafer using a spinner, and the composition was then baked at 225° C. for 60 seconds and dried, thereby forming an organic anti-reflection film having a film thickness of 77 nm.

Then, a resist composition solution obtained above was uniformly applied onto the anti-reflection film using a spinner, and was then prebaked (PAB) on a hotplate at a temperature indicated in Table 3 for 60 seconds, thereby forming a resist film (see Table 3).

Subsequently, the resist film was selectively irradiated with an ArF excimer laser (193 nm) through a mask pattern (half tone), using an ArF exposure apparatus NSR-S302 (manufactured by Nikon Corporation, NA (numerical aperture)=0.60, ⅔ annular illumination) in Examples 1 to 8, and an ArF exposure apparatus NSR-S306 (manufactured by Nikon Corporation, NA (numerical aperture)=0.78, ⅔ annular illumination) in Example 9.

Thereafter, a post exposure bake (PEB) treatment was conducted at a temperature indicated in Table 3 for 60 seconds, followed by development for 30 seconds at 23° C. in a 2.38% by weight aqueous solution of tetramethylammonium hydroxide (TMAH). Then, the resist was washed for 30 seconds with water, followed by drying, thereby forming a line and space (1:1) resist pattern.

<Sensitivity>

Example 1

The sensitivity (Eop, mJ/cm$^2$) with which a line and space pattern (L/S pattern) having a line width of 250 nm and a pitch of 500 nm was measured. Eop indicates the optimum exposure dose.

Examples 2-8

The sensitivity (Eop, mJ/cm$^2$) with which a line and space pattern (L/S pattern) having a line width of 120 nm and a pitch of 240 nm was measured.

Example 9

The sensitivity (Eop, mJ/cm$^2$) with which a line and space pattern (L/S pattern) having a line width of 90 nm and a pitch of 180 nm was measured.

<Resolution>

With the above-mentioned Eop, the pattern size was varied, and the minimum size of pattern which can be resolved was determined as the critical resolution (nm).

The results are shown in Table 3.

TABLE 3

|       | Resist film thickness (nm) | PAB (° C.) | PEB (° C.) | Eop (mJ/cm$^2$) | Critical resolution (nm) |
|-------|---|---|---|---|---|
| Ex. 1 | 200 | 100 | 120 | 24 | 250 |
| Ex. 2 | 250 | 115 | 115 | 35 | 110 |
| Ex. 3 | 250 | 105 | 105 | 28 | 110 |
| Ex. 4 | 250 | 105 | 105 | 38 | 110 |
| Ex. 5 | 130 | 100 | 105 | 33 | 110 |
| Ex. 6 | 130 | 100 | 105 | 65 | 110 |
| Ex. 7 | 130 | 90 | 90 | 48 | 110 |
| Ex. 8 | 130 | 90 | 90 | 53 | 110 |
| Ex. 9 | 150 | 105 | 105 | 65.3 | 90 |

<Line Width Roughness (LWR)>

With respect to the line and space pattern having a line width of 90 nm and a pitch of 180 nm formed with the above-mentioned Eop in Example 9, 5 points in the lengthwise direction of the line were measured using a measuring SEM ((product name: S-9220, manufactured by Hitachi, Ltd.)), and from the results, the value of 3 times the standard deviation s (i.e., 3s) was calculated as a yardstick of LWR. The smaller this 3s value is, the lower the level of roughness of the line width, indicating that a resist pattern with a uniform width was obtained.

As a result, the LWR was 5.9 nm, which is an extremely low value.

From the results shown in Table 3, it was confirmed that extremely fine resist patterns could be formed using the resist compositions of Examples 1 to 9 according to the present invention.

Further, it was confirmed that the resist compositions of Examples 1 to 9 according to the present invention were capable of forming resist patterns with reduced LWR.

Next, using the positive resist composition solutions of Examples 10 and 11 and Comparative Example 1, the following evaluations were performed.

[Formation of Resist Pattern]

An organic anti-reflection film composition (product name: ARC29, manufactured by Brewer Science Ltd.) was uniformly applied onto a silicon wafer using a spinner, and the composition was then baked at 225° C. for 60 seconds and dried, thereby forming an organic anti-reflection film having a film thickness of 77 nm.

Then, each of the positive resist composition solutions of Examples 10 and 11 and Comparative Example 1 was uniformly applied onto the anti-reflection film using a spinner, and was then prebaked (PAB) on a hotplate at a temperature indicated in Tables 4 and 5 for 60 seconds, thereby forming a resist film having a film thickness of 120 nm.

Subsequently, using the apparatuses and conditions indicated in items (1) and (2) below, the resist film was selectively irradiated with an ArF excimer laser (193 nm) through a mask pattern (half tone).

(1) NSR-S306; NA (numerical aperture)=0.78, ⅔ annular illumination (2) ASML 1400; NA (numerical aperture)=0.93, sigma C-Quad Thereafter, a post exposure bake (PEB) treatment was conducted at a temperature indicated in Tables 4 and 5 for 60 seconds, followed by development for 30 seconds at 23° C. in a 2.38% by weight aqueous solution of tetramethylammonium hydroxide (TMAH). Then, the resist was washed for 30 seconds with water, followed by drying, thereby forming a line and space (1:1) resist pattern.

Using the Apparatus and Conditions of Item (1)
<Sensitivity>

The sensitivity (Eop, mJ/cm$^2$) with which a line and space pattern (L/S pattern) having a line width of 80 nm and a pitch of 160 nm was measured.

<Line Width Roughness (LWR)>

With respect to the line and space pattern having a line width of 80 nm and a pitch of 160 nm formed with the above-mentioned Eop, the LWR (nm) was determined in the same manner as described above. The results are shown in Table 4.

<Collapse Margin>

In the formation of a L/S pattern targeting a line width of 80 nm and a pitch of 160 nm, the exposure time of the selective exposure was gradually increased to make the exposure dose larger than the Eop, and the occurrence of pattern collapse was observed using a scanning electron microscope (SEM).

The exposure dose at which pattern collapse started to occur was defined as T, and the collapse margin was determined by the following formula:

Collapse margin(unit:%)=(T/Eop)×100

The results are shown in Table 4.

TABLE 4

|  | PAB (° C.) | PEB (° C.) | Eop (mJ/cm$^2$) | LWR (nm) | Collapse margin (%) |
|---|---|---|---|---|---|
| Ex. 10 | 100 | 100 | 79.0 | 9.8 | +16 |
| Ex. 11 | 100 | 95 | 83.2 | 9.3 | +20 |
| Comp. Ex. 1 | 120 | 115 | 75.0 | 9.3 | +4 |

Using the Apparatus and Conditions of Item (2)
<Sensitivity>

The sensitivity (Eop, mJ/cm$^2$) with which a line and space pattern (L/S pattern) having a line width of 60 nm and a pitch of 120 mm was measured.

<Line Width Roughness (LWR)>

With respect to the line and space pattern having a line width of 60 nm and a pitch of 120 nm formed with the above-mentioned Eop, the LWR (nm) was determined in the same manner as described above. The results are shown in Table 5.

<Mask Error Factor (MEF)>

With the above-mentioned Eop, L/S patterns were formed by fixing the pitch at 120 nm and changing the mask size to 57 nm, 58 nm, 59 nm, 60 nm, 61 nm and 62 nm, and with respect to the formed L/S patterns, the mask error factor was determined.

The value of the mask error factor is the gradient of a graph obtained by plotting the target line width (nm) of the mask pattern on the horizontal axis, and the actual line width (nm) of the formed L/S pattern on the vertical axis. A MEF value closer to 1 indicates that a resist pattern faithful to the mask pattern was formed. The results are shown in Table 5.

<Depth of Focus (DOF)>

With the above-mentioned Eop, the focus was appropriately shifted up and down, and the depth of focus (DOF) (unit: nm) with which a L/S pattern was formed within the range where the variation in the target size of the L/S pattern was 60 nm±10% (i.e., 54 to 66 nm) was determined. The results are shown in Table 5.

TABLE 5

|  | PAB (° C.) | PEB (° C.) | Eop (mJ/cm$^2$) | LWR (nm) | MEF | DOF (nm) |
|---|---|---|---|---|---|---|
| Ex. 10 | 100 | 100 | 65.3 | 5.7 | 5.05 | 0.30 |
| Comp. Ex. 1 | 120 | 115 | 65.0 | 6.1 | 5.70 | 0.25 |

From the results shown in Tables 4 and 5, it was confirmed that extremely fine resist patterns could be formed using the positive resist compositions of Examples 10 and 11 according to the present invention.

Further, it was confirmed that, as compared with the positive resist composition of Comparative Example 1 outside the scope of the present invention, the positive resist compositions of Examples 10 and 11 according to the present invention exhibited the same level of LWR, and the collapse margin was excellent.

Furthermore, it was confirmed that, as compared with the positive resist composition of Comparative Example 1 outside the scope of the present invention, the positive resist composition of Example 10 according to the present invention exhibited excellent LWR, MEF and DOF.

Industrial Applicability

According to the present invention, there are provided a novel resin, a resist composition using the resin, and a method of forming a resist pattern using the resist composition.

The invention claimed is:

1. A resist composition comprising a base resin component (A) and an acid-generator component (B) which generates acid upon exposure, said component (A) comprising a resin (A1) which has a structural unit (a0) represented by general formula (a-0) shown below:

[Chemical Formula 1]

(a-0)

wherein R represents a hydrogen atom, a halogen atom, a lower alkyl group or a halogenated lower alkyl group; a represents an integer of 0 to 2; b represents an integer of 1 to 3; c represents an integer of 1 to 2; and a+b is an integer of 2 or more.

2. The resist composition according to claim 1, wherein said structural unit (a0) is 3-methacryloyloxy-4-hydroxytetrahydrofuran.

3. The resist composition according to claim 1, wherein said component (A) is a resin component (A') which exhibits increased alkali solubility under action of acid.

4. The resist composition according to claim 3, wherein said resin (A1) further has a structural unit (a1) derived from an acrylate ester having an acid dissociable, dissolution inhibiting group.

5. The resist composition according to claim 4, wherein said resin (A1) further has a structural unit (a3) derived from an acrylate ester having a polar group-containing aliphatic hydrocarbon group, excluding said structural unit (a0).

6. The resist composition according to claim 3, wherein said resin (A1) further has a structural unit (a3) derived from an acrylate ester having a polar group-containing aliphatic hydrocarbon group, excluding said structural unit (a0).

7. The resist composition according to claim 1, wherein said component (A) is an alkali-soluble resin component (A"), and further comprises a cross-linker component (C).

8. The resist composition according to claim 7, wherein said resin (A1) within said component (A) consists of said structural unit (a0).

9. The resist composition according to claim 7, which further comprises a nitrogen-containing organic compound (D).

10. The resist composition according to claim 1, which further comprises a nitrogen-containing organic compound (D).

11. A method of forming a resist pattern, comprising: applying a resist composition of any one of claims 1 to 9 to a substrate to form a resist film on the substrate; conducting exposure of said resist film; and alkali-developing said resist film to form a resist pattern.

12. A resin comprising a structural unit (a0) represented by general formula (a-0) shown below:

[Chemical Formula 2]

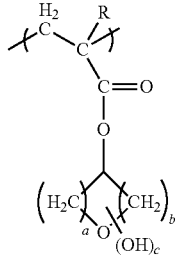

(a-0)

wherein R represents a hydrogen atom, a halogen atom, a lower alkyl group or a halogenated lower alkyl group; a represents an integer of 0 to 2; b represents an integer of 1 to 3; c represents an integer of 1 to 2; and a+b is an integer of 2 or more.

13. The resin according to claim 12, wherein said structural unit (a0) is 3-methacryloyloxy-4-hydroxytetrahydrofuran.

* * * * *

UNITED STATES PATENT AND TRADEMARK OFFICE
CERTIFICATE OF CORRECTION

| | |
|---|---|
| PATENT NO. | : 7,939,243 B2 |
| APPLICATION NO. | : 12/160742 |
| DATED | : May 10, 2011 |
| INVENTOR(S) | : Masaru Takeshita et al. |

It is certified that error appears in the above-identified patent and that said Letters Patent is hereby corrected as shown below:

Title Page, Item (75) Inventors: change city of residence of Yuji Ohgomori from "Kawasaki" to --Yokohama--.

At Title Page 1, (Item 56) Column 2, Line 19, Under Other Publications, change "Hadwiger at al.," to --Hadwiger et al.,--.

At Column 9, Line 58, After "ring" insert --.--.

At Column 36, Line 21-44, change " 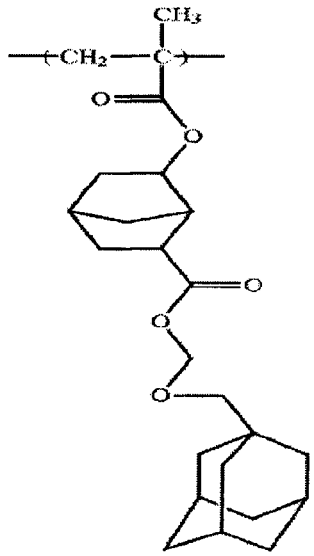 " to

Signed and Sealed this
First Day of November, 2011

David J. Kappos
*Director of the United States Patent and Trademark Office*

--  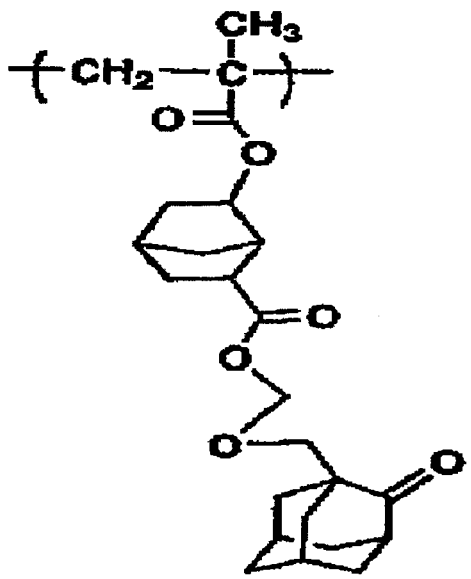  --.
At Column 47, Line 48, change "norbonyl" to --norbornyl--.
At Column 47, Line 51, change "2-norbonyl" to --2-norbornyl--.
At Column 47, Line 51, change "3-norbonyl" to --3-norbornyl--.